(12) United States Patent
Doubina et al.

(10) Patent No.: US 9,777,386 B2
(45) Date of Patent: Oct. 3, 2017

(54) CHEMISTRY ADDITIVES AND PROCESS FOR COBALT FILM ELECTRODEPOSITION

(71) Applicant: Lam Research Corporation, Fremont, CA (US)

(72) Inventors: Natalia V. Doubina, Portland, OR (US); Matthew A. Rigsby, Tualatin, OR (US); Jonathan David Reid, Sherwood, OR (US)

(73) Assignee: Lam Research Corporation, Fremont, CA (US)

( * ) Notice: Subject to any disclaimer, the term of this patent is extended or adjusted under 35 U.S.C. 154(b) by 295 days.

(21) Appl. No.: 14/663,279

(22) Filed: Mar. 19, 2015

(65) Prior Publication Data

US 2016/0273117 A1    Sep. 22, 2016

(51) Int. Cl.
*C25D 3/12*    (2006.01)
*C25D 3/18*    (2006.01)
(Continued)

(52) U.S. Cl.
CPC .......... *C25D 3/12* (2013.01); *C25D 3/18* (2013.01); *C25D 5/34* (2013.01); *C25D 7/123* (2013.01);
(Continued)

(58) Field of Classification Search
CPC ........ C25D 17/001; C25D 7/123; C25D 7/12; C25D 3/12–3/18
(Continued)

(56) References Cited

U.S. PATENT DOCUMENTS 2,017,646 A * 10/1935 Berger ............... C25D 3/12
                                                205/269
6,036,833 A *  3/2000 Tang ................. C25D 3/12
                                                205/103
(Continued)

FOREIGN PATENT DOCUMENTS

JP    WO 2004040041 A1 *  5/2004  ........... B22F 1/0018

OTHER PUBLICATIONS

U.S. Appl. No. 14/020,339, titled "Method and Apparatus for Remote Plasma Treatment for Reducing Metal Oxides on a Metal Seed Layer," filed Sep. 6, 2013.
U.S. Appl. No. 14/069,220, title "Wafer Entry Port With Gas Concentration Attenuators," filed Oct. 31, 2013.
(Continued)

*Primary Examiner* — Brian W Cohen
(74) *Attorney, Agent, or Firm* — Weaver Austin Villeneuve & Sampson LLP

(57) ABSTRACT

Various embodiments herein relate to methods and apparatus for electroplating cobalt on a substrate. In many cases, the cobalt is electroplated into recessed features. The recessed features may include a seed layer such as a cobalt seed layer. Electroplating may occur through a bottom-up mechanism. The bottom-up mechanism may be achieved by using particular additives (e.g., accelerator and suppressor), which may be present in the electrolyte at particular concentrations. Further, leveler, wetting agent, and/or brightening agents may be used to promote high quality plating results. In various embodiments, the substrate is pre-treated to remove oxide (and in some cases carbon impurities) from the seed layer before electroplating takes place. Further, the electrolyte may have a particular conductivity to promote uniform plating results across the face of the substrate.

22 Claims, 15 Drawing Sheets

PEI/MPS

(51) Int. Cl.
*C25D 7/12* (2006.01)
*C25D 17/00* (2006.01)
*C25D 5/34* (2006.01)
*H01L 21/288* (2006.01)
*H01L 21/768* (2006.01)
*H01L 23/532* (2006.01)

(52) U.S. Cl.
CPC ........ *C25D 17/001* (2013.01); *H01L 21/2885* (2013.01); *H01L 21/76862* (2013.01); *H01L 21/76864* (2013.01); *H01L 21/76873* (2013.01); *H01L 21/76877* (2013.01); *H01L 23/53257* (2013.01)

(58) Field of Classification Search
USPC .................................................. 205/255, 269
See application file for complete search history.

(56) References Cited

U.S. PATENT DOCUMENTS

| | | |
|---|---|---|
| 6,126,798 A | 10/2000 | Reid et al. |
| 6,156,167 A | 12/2000 | Patton et al. |
| 6,569,299 B1 | 5/2003 | Reid et al. |
| 6,800,187 B1 | 10/2004 | Reid et al. |
| 8,703,615 B1 | 4/2014 | Ponnuswamy et al. |
| 2009/0255820 A1* | 10/2009 | Buttard ............... B81C 1/00126 205/123 |
| 2015/0270133 A1* | 9/2015 | Lam .................... H01L 21/2885 205/157 |

OTHER PUBLICATIONS

Di Bari, G. A., "Electrodeposition of Nickel," *Modern Electroplating*, Fifth Edition (eds M. Schlesinger and M. Paunovic), John Wiley & Sons, Inc., Hoboken, NJ, USA, (2010), pp. 79-114.

* cited by examiner

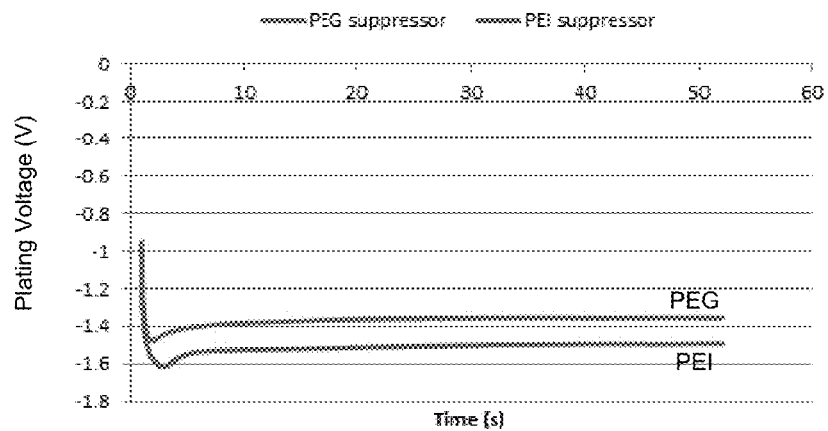
FIG. 2
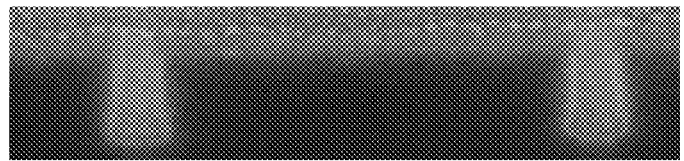
FIG. 3A                PEI/MPS
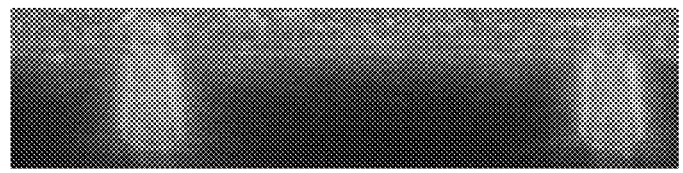
FIG. 3B                PEI/TU
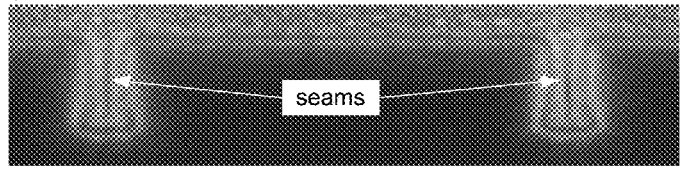
FIG. 3C                PEI/TIS
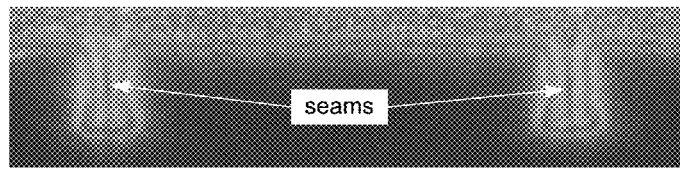
FIG. 3D                PEI/DPS PEI (30 ppm),
MPS (150 ppm)
1.6 mA/cm².

PEI (30 ppm),
MPS (150 ppm)
6.3 mA/cm².

PEI (30 ppm),
MPS (300 ppm)
1.6 mA/cm².

PEI (30 ppm),
TU (400 ppm)
1.6 mA/cm².

| Concentration of Co(II) (g/L) | Conductivity (mS/cm) |
|---|---|
| 0.5 | 1.29 |
| 1 | 2.26 |
| 2 | 3.85 |
| 3 | 5.32 |
| 5 | 7.72 |
| 25 | 25.5 |

CHEMISTRY ADDITIVES AND PROCESS FOR COBALT FILM ELECTRODEPOSITION

BACKGROUND

Electroplating has long been used in the semiconductor industry to deposit metal on substrates. One metal commonly deposited through electroplating is copper, and specific electrolytes and plating methods have been developed to optimize copper deposition on substrates. These methods do not result in high quality film when used to plate other metals such as cobalt. For instance, conventionally electroplated cobalt film may suffer problems such as issues related to impure and oxidized seed layers, overly rough film, non-uniform film deposition across a substrate, and/or undesirably conformal film leading to seams/voids in a recessed feature. As such, there exists a need for improved methods to electroplate high quality cobalt film.

SUMMARY

Certain embodiments herein relate to methods and apparatus for electroplating cobalt. In many cases, cobalt is deposited into recessed features on a semiconductor substrate. The deposition may occur through a bottom-up mechanism in various embodiments.

In one aspect of the embodiments herein, a method is provided for electroplating cobalt into recessed features on a substrate, the method including: receiving the substrate in an electroplating chamber, the substrate including recessed features having a cobalt seed layer thereon, the cobalt seed layer having a thickness of about 50 Å or less, and the recessed features having a width between about 10-150 nm; immersing the substrate in electrolyte, the electrolyte including boric acid, halide ions, cobalt ions, and organic additives for achieving seam-free bottom-up fill in the recessed features; and electroplating cobalt into the features under conditions that provide bottom-up fill, where a plating potential at the substrate during electroplating has a magnitude between about 1.0-3.5 V vs. a $HgSO_4$ mercury sulfate reference electrode.

In various embodiments, the electrolyte may have a conductivity of about 10 mS/cm or less. The electrolyte may have a cobalt ion concentration of about 5 g/L or less. The organic additives in the electrolyte may include a suppressor that includes a nitrogen-containing group. For example, in some cases the suppressor includes an amine group. In another example, the suppressor includes polyethyleneimine (PEI). An accelerator may also be used in various embodiments. In some cases, the accelerator is selected from the group consisting of 3-mercapto-1-propane sulfonic acid sodium salt (MPS), thiourea, and combinations thereof. In some such cases, the organic additives further include a suppressor including polyethyleneimine (PEI).

The organic additives may be present at particular concentrations in some implementations. For instance, in some cases the suppressor is present in the electrolyte at a concentration between about 10-60 ppm, and the accelerator is present in the electrolyte at a concentration between about 150-400 ppm. These additive concentrations may in some cases be used to plate at a constant current density during bottom-up fill, the current density being between about 0.5-7 $mA/cm^2$.

In certain embodiments, the organic additives include an accelerator and a suppressor, and a ratio of the concentration of accelerator to the concentration of suppressor in the electrolyte is at least about 3:1, as measured in ppm. In some cases, the concentration of accelerator in the electrolyte is between about 150-500 ppm and the concentration of suppressor in the electrolyte is between about 10-60 ppm.

The method may include additional steps to pre-treat the substrate in some cases. For instance, the method may include before receiving the substrate in the electroplating chamber, pre-treating the substrate by exposing the substrate to a remotely generated hydrogen-containing plasma to thereby reduce oxides present on the cobalt seed layer. The remote plasma pre-treatment may reduce the seed layer's sheet resistance by at least about 15% to a value that is between about 50-1000 $\Omega/cm^2$. In another pre-treatment technique, the method may include before receiving the substrate in the electroplating chamber, annealing the substrate at a temperature of at least about 75° C. while the substrate is exposed to reducing gas to thereby reduce oxides present on the cobalt seed layer. The anneal pre-treatment may reduce the seed layer's sheet resistance by at least about 15% to a value that is between about 50-1000 $\Omega/cm^2$.

The waveform used during electroplating can affect the quality of the fill results. In some embodiments, the substrate is immersed at open circuit conditions, where an induction period occurs after immersion, during which no voltage or current is applied to the substrate, the induction period having a duration between about 0.5-5 seconds. In some cases, the magnitude of the plating potential at the substrate during electroplating is at least about 1.5 V vs. a $HgSO_4$ mercury sulfate reference electrode. For example, the magnitude of the plating potential at the substrate may be at least about 1.8V vs. a $HgSO_4$ mercury sulfate reference electrode.

In some cases additional additives are present in the electrolyte. For example, in some cases the electrolyte further includes a leveler and/or wetting agent. The leveler and/or wetting agent may include polyethylene glycol (PEG) in some embodiments, the PEG being present in electrolyte at a concentration between about 10-500 ppm. The electroplated cobalt may have an RMS roughness of about 3 nm or lower. In various implementations, the electrolyte includes cobalt ions, boric acid, and polyethylene glycol. In a particular example, the electrolyte includes (i) between about 0.5-5 g/L cobalt(II) ions, (ii) between about 2-35 g/L boric acid, (iii) between about 0.1-0.3 g/L polyethylene glycol, and (iv) a pH between about 4-6.

The electrolyte may include a particular accelerator and suppressor in some embodiments. For instance, in various cases, the electrolyte may include (i) an accelerator selected from the group consisting of: N,N-dimethyl-dithiocarbamic acid (-3-sulfopropyl)ester, 3-mercapto-propylsulfonic acid-(3-sulfurpropyl) ester, 3-sulfanyl-1-propane sulfonate, carbonic acid-dithio-o-ethylester-s-ester with 3-mercapto-1-propane sulfonic acid potassium salt, bis-sulfopropyl disulfide, 3-(benzothiazolyl-s-thio)propyl sulfonic acid sodium salt, pyridinium propyl sulfobetaine, 1-sodium-3-mercaptopropane-1-sulfonate, N,N-dimethyl-dithiocarbamic acid-(3-sulfoethyl)ester, 3-mercapto-ethyl propylsulfonic acid (3-sulfoethyl)ester, 3-mercapto-ethylsulfonic acid sodium salt, carbonic acid-dithio-o-ethyl ester-s-ester, pyridinium ethyl sulfobetaine, thiourea, and combinations thereof; and (ii) a suppressor selected from the group consisting of: carboxymethylcellulose, nonylphenolpolyglycol ether, polyethylene glycoldimethyl ether, octandiolbis (polyalkylene glycol ether), octanol polyalkylene glycol ether, oleic acid polyglycol ester, polyethylene propylene glycol, polyethylene glycol, polyethyleneimine, polyethylene glycoldimethyl ether, polyoxypropylene glycol, polypropylene glycol, polyvinyl alcohol, stearic acid polyglycol ester, stearyl alcohol polyglycol ether, polyethylene oxide, ethylene oxide-propylene oxide copolymers, butyl alcohol-ethylene oxide-propylene oxide copolymers, 2-Mercapto-5-benzimidazolesulfonic acid, 2-mercaptobenzimidazole (MBI), benzotriazole, and combinations thereof.

The electrolyte may also include a particular leveler, wetting agent, and brightening agent. In some cases the electrolyte includes (iii) a leveler selected from the group consisting of: alkylated polyalkyleneimines, polyethylene glycol, organic sulfonates, 4-mercaptopyridine, 2-mercaptothiazoline, ethylene thiourea, thiourea, 1-(2-hydroxyethyl) 2-imidazolidinethion, sodium naphthalene 2-sulphonate, acrylamide, substituted amines, imidazole, triazole, tetrazole, piperidine, morpholine, piperazine, pyridine, oxazole, benzoxazole, quinolin, isoquinoline, coumarin, butyne 1:4 diol and derivatives thereof, and combinations thereof; (iv) a wetting agent selected from the group consisting of: alkyl phenoxy polyethoxyethanols, compounds of polyoxyethylene and polyethyleneglycol polymers, block and random copolymers of polyoxyethylene and polyoxypropylene, and combinations thereof; and (v) a brightening agent selected from the group consisting of: 3-sulfanyl-1-propane sulfonate, 2-mercapto-ethane sulfonic acid sodium salt, bisulfopropyl disulfide, N,N-dimethyldithiocarbamic acid ester sodium salt, (o-ethyldithiocarbonato)-S-(3-sulfurpropyl)-ester potassium salt, 3-[(amino-iminomethyl)-thio]-1-propane sulfonic acid sodium salt, phenolphthalein, lactone, lactams, cyclic sulfate esters, cyclic imides, cyclic oxazolinones, assymetrical alkyne sulfonic acids, (N-substituted pyridyl)-alkyl sulfonic acid betaines, amino polyarylmethanes, pyridine derivatives, quinoline derivatives, sulfonated aryl aldehydes, and combinations thereof.

In a further aspect of the disclosed embodiments, an apparatus for electroplating cobalt into recessed features on a substrate is provided. The apparatus may include hardware for performing the methods disclosed herein and a controller having instructions to implement the methods disclosed herein. In one example, the apparatus includes: an electroplating chamber configured to hold electrolyte; a substrate holder configured to hold the substrate in the electrolyte; a power supply; and a controller including instructions for: immersing the substrate in electrolyte, the substrate including recessed features having a cobalt seed layer thereon, the cobalt seed layer having a thickness of about 50 Å or less, and the recessed features having a width between about 10-150 nm, the electrolyte including boric acid, halide ions, cobalt ions, and organic additives for achieving seam-free bottom-up fill in the recessed features; and electroplating cobalt into the features under conditions that provide bottom-up fill, where a plating potential on the substrate during electroplating has a magnitude between about 1-3.5 V vs. a $HgSO_4$ mercury sulfate reference electrode.

These and other features will be described below with reference to the associated drawings.

BRIEF DESCRIPTION OF THE DRAWINGS

FIG. 2 shows the plating voltage for electrolytes including two different types of suppressor.

FIGS. 3A-3D depict recessed features filled with cobalt using various combinations of accelerators and suppressors.

DETAILED DESCRIPTION

Figure 1A:
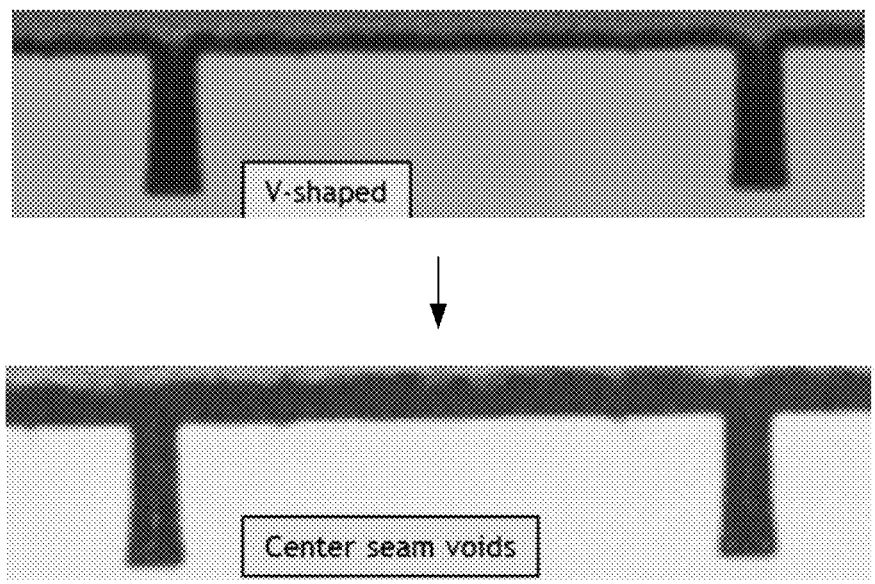
FIG. 1A shows a recessed feature plated with cobalt, where the feature is filled conformally.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. Further, the terms "electrolyte," "plating bath," "bath," and "plating solution" are used interchangeably. The following detailed description assumes the embodiments are implemented on a wafer. However, the embodiments are not so limited. The work piece may be of various shapes, sizes, and materials. In addition to semiconductor wafers, other work pieces that may take advantage of the disclosed embodiments include various articles such as printed circuit boards, magnetic recording media, magnetic recording sensors, mirrors, optical elements, micro-mechanical devices and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Various embodiments herein are directed to methods and apparatus for electroplating cobalt onto a substrate. Conventional plating methods for depositing cobalt suffer from various problems that result in poor quality plating results. The methods described herein present various techniques for electroplating high quality cobalt. The disclosed techniques can be combined as desired for a particular application, and such combinations of techniques are considered to be within the scope of the disclosed embodiments.

Conformal Vs. Bottom-Up Fill

Bottom-up fill relates to an electroplating mechanism where the deposited material grows upwards from the bottom of a recessed feature. This fill behavior is different from conformal fill, where the deposited material grows inwards from the sidewalls of a recessed feature. Bottom-up fill behavior and various additives that contribute to such behavior are further described below.

One problem that may be encountered when cobalt is electroplated into recessed features is that the cobalt may deposit conformally rather than in a bottom-up fashion. This conformal fill behavior leads to the formation of seams or voids within a recessed feature. These seams/voids form when material conformally deposits on sidewalls and the sidewalls approach one another toward the end of the fill stage. By contrast, where the fill occurs in a bottom-up manner, the material deposits from the bottom of a recessed feature upwards, and the voids/seams are prevented from forming. The use of particular chemical additives as described below can help promote bottom-up fill.

FIG. 1A shows scanning transmission electron microscopy (STEM) images for an electroplating process that results in conformal fill leading to center seam voids. The top portion of the image shows a view of recessed features during the deposition, and the bottom portion of the image shows a view of recessed features after the deposition. As shown in the top portion of the figure, deposition occurs with characteristic V-shaped growth corresponding to conformal fill. As shown in the bottom portion of the figure, the resulting fill includes center seam voids.

Figure 1B:
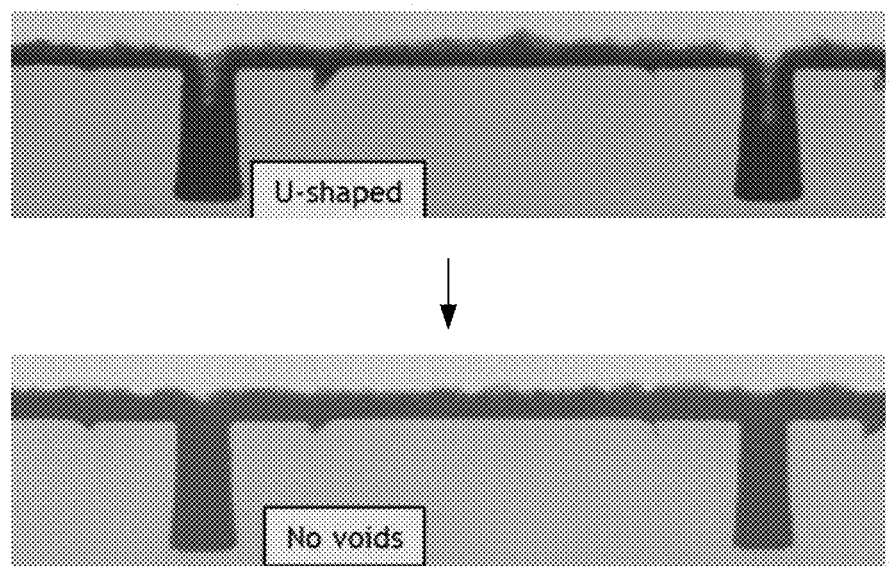
FIG. 1B shows a recessed feature plated with cobalt, where the feature is filled in a bottom-up manner.

FIG. 1B shows STEM images for an electroplating process that results in bottom-up growth. The top portion of the image shows a view of recessed features during the deposition, and the bottom portion of the image shows a view of recessed features after the deposition. As shown in the top portion of the figure, deposition occurs with characteristic U-shaped growth corresponding to bottom-up fill. As shown in the bottom portion of the figure, the resulting fill is high quality and does not include any seams or voids.

To date, bottom-up fill methods have largely been optimized in the context of depositing copper in recessed features. As such, the electrolytes/additive packages are typically optimized for high quality copper plating. When such electrolytes/additives are used to deposit cobalt, the bottom-up fill behavior may be significantly compromised and the fill may proceed from the sidewalls inward rather than from the bottom upward. Disclosed herein are particular additives that are useful in promoting bottom-up fill in the context of electroplating cobalt.

Suppressors

While not wishing to be bound to any theory or mechanism of action, it is believed that suppressors (either alone or in combination with other bath additives) are surface-kinetic polarizing compounds that lead to a significant increase in the voltage drop across the substrate-electrolyte interface, especially when present in combination with a surface chemisorbing halide (e.g., chloride or bromide). The halide may act as a chemisorbed-bridge between the suppressor molecules and the wafer surface. The suppressor both (1) increases the local polarization of the substrate surface at regions where the suppressor is present relative to regions where the suppressor is absent, and (2) increases the polarization of the substrate surface generally. The increased polarization (local and/or general) corresponds to increased resistivity/impedance and therefore slower plating at a particular applied potential.

It is believed that suppressors are not significantly incorporated into the deposited film, though they may slowly degrade over time by electrolysis or chemical decomposition in the bath. Suppressors are often relatively large molecules, and in many instances they are polymeric in nature. Some suppressors include polyethylene and polypropylene oxides with S- and/or N-containing functional groups, block polymers of polyethylene oxide and polypropylene oxides, etc. Particular examples of suppressors that may be useful in various embodiments where cobalt is electroplated include, but are not limited to: carboxymethylcellulose; nonylphenolpolyglycol ether; polyethylene glycoldimethyl ether; octandiolbis(polyalkylene glycol ether); octanol polyalkylene glycol ether; oleic acid polyglycol ester; polyethylene propylene glycol; polyethylene glycol; polyethyleneimine; polyethylene glycoldimethyl ether; polyoxypropylene glycol; polypropylene glycol; polyvinyl alcohol; stearic acid polyglycol ester; stearyl alcohol polyglycol ether; polyethylene oxide; ethylene oxide-propylene oxide copolymers; butyl alcohol-ethylene oxide-propylene oxide copolymers; 2-Mercapto-5-benzimidazolesulfonic acid; 2-mercaptobenzimidazole (MBI); and benzotriazole. Combinations of these suppressors may also be used.

In some embodiments, the suppressor includes one or more nitrogen atoms such as an amine group or an imine group. In some embodiments, the suppressor is a polymeric or oligomeric compound containing amine groups separated by a carbon aliphatic spacer such as $CH_2CH_2$ or $CH_2CH_2CH_2$. In a particular embodiment, the suppressor is polyethyleneimine (PEI, also known as polyaziridine, poly[imino(1,2-ethanediyl)], or poly(iminoethylene)). PEI has shown very good bottom-up fill characteristics in the context of cobalt deposition, as shown in the experimental results included herein. The other identified suppressors may also be particularly useful in the context of cobalt deposition.

The suppressor chosen may be a relatively strong suppressor. Stronger suppressors (which exhibit stronger polarization) have been shown to produce better bottom-up fill results in the context of cobalt deposition. The suppressor chosen may be a stronger suppressor than polyethylene glycol (PEG). In some cases the suppressor chosen may be at least as strong of a suppressor as PEI. FIG. 2 shows a polarization graph for PEI and PEG suppressors over time. FIG. 2 illustrates that PEI is a much stronger suppressor than PEG. In particular, the plating voltage where PEI is used is about 150 mV more negative than where PEG is used. Differences in the configuration and structure of the molecules generate variations in polarization strength, surface adsorption rate and accelerator displacement rate.

The suppressors can have linear chain structures, branch structures, or both. It is common that suppressor molecules with various molecular weights co-exist in a commercial suppressor solution. Due in part to suppressors' large size, the diffusion of these compounds into a recessed feature can be relatively slow compared to other bath components. In some embodiments, the average molecular weight of the suppressor, which as mentioned may be a polymeric amine-containing material, may be between about 200-600 g/mol, or between about 300-1000 g/mol, or between about 500-1500 g/mol. By contrast, the suppressor polyethylene glycol (PEG) is commonly provided at a molecular weight between about 1,500-10,000 g/mol when used to electroplate copper.

The suppressor may be provided in the electrolyte at a concentration between about 1-10,000 ppm, for example between about 10-60 ppm, or between about 15-60 ppm, or between about 30-60 ppm. In this context, parts per million (ppm) is a mass fraction of the suppressor molecules in the electrolyte. In some cases, the suppressor may have a concentration of at least about 10 ppm, or at least about 15 ppm, or at least about 20 ppm, or at least about 30 ppm, or at least about 50 ppm. In these or other cases, the suppressor may have a concentration of about 1,000 ppm or less, for example about 500 ppm or less, about 100 ppm or less, about 75 ppm or less, about 60 ppm or less, or about 50 ppm or less. Different suppressors may have different optimal concentrations. In various embodiments, the suppressor is PEI and is present in electrolyte at a concentration that meets one or more of the limitations set out in this paragraph.

Accelerators

While not wishing to be bound by any theory or mechanism of action, it is believed that accelerators (either alone or in combination with other bath additives) tend to locally reduce the polarization effect associated with the presence of suppressors, and thereby locally increase the electrodeposition rate. The reduced polarization effect is most pronounced in regions where the adsorbed accelerator is most concentrated (i.e., the polarization is reduced as a function of the local surface concentration of adsorbed accelerator).

Although the accelerator may become strongly adsorbed to the substrate surface and generally laterally-surface immobile as a result of the plating reactions, the accelerator is generally not significantly incorporated into the film. Thus, the accelerator remains on the surface as metal is deposited. As a recess is filled, the local accelerator concentration increases on the surface within the recess. Accelerators tend to be smaller molecules and exhibit faster diffusion into recessed features, as compared to suppressors.

Example accelerators that may be useful for depositing cobalt include, but are not limited to: N,N-dimethyl-dithiocarbamic acid (-3-sulfopropyl)ester; 3-mercapto-propylsulfonic acid-(3-sulfurpropyl) ester; 3-sulfanyl-1-propane sulfonate; carbonic acid-dithio-o-ethylester-s-ester with 3-mercapto-1-propane sulfonic acid potassium salt; bis-sulfopropyl disulfide; 3-(benzothiazolyl-s-thio)propyl sulfonic acid sodium salt; pyridinium propyl sulfobetaine; 1-sodium-3-mercaptopropane-1-sulfonate; N,N-dimethyl-dithiocarbamic acid-(3-sulfoethyl)ester; 3-mercapto-ethyl propylsulfonic acid (3-sulfoethyl)ester; 3-mercapto-ethylsulfonic acid sodium salt; carbonic acid-dithio-o-ethyl ester-s-ester; pyridinium ethyl sulfobetaine; and thiourea. In some cases a combination of these accelerators is used. In a particular embodiment the accelerator is 3-sulfanyl-1-propane sulfonate (commonly referred to as MPS or 3-mercapto-1-propane sulfonic acid sodium salt) and/or thiourea (TU). The accelerator chosen may include, in some cases, a sulfonic acid component and/or an ester component and/or a thiol group.

In some embodiments, the accelerator is present in electrolyte at a concentration between about 1-10,000 ppm, for example between about 150-500 ppm, or between about 150-400 ppm. In some embodiments, the concentration of accelerator is at least about 100 ppm, at least about 150 ppm, at least about 200 ppm, or at least about 300 ppm. In these or other cases, the concentration of accelerator may be about 1,000 ppm or less, or about 500 ppm or less, or about 400 ppm or less. The optimal accelerator concentration may depend on the identity of the accelerator that is used. In various embodiments, the accelerator is MPS and is present in electrolyte at a concentration that meets one or more of the limitations set out in this paragraph. In certain other embodiments, the accelerator is thiourea and is present in electrolyte at a concentration that meets one or more of the limitations set out in this paragraph.

In certain implementations, a particular combination of suppressor and accelerator may be used. In one embodiment, the suppressor is PEI and the accelerator is MPS. In another embodiment, the suppressor is PEI and the accelerator is thiourea.

Another characteristic that can affect bottom-up fill is the ratio of accelerator to suppressor in the electrolyte. In some embodiments, the ratio of accelerator:suppressor is at least about 3:1, for example at least about 4:1, as measured in terms of ppm (which is measured based on mass). In other words, there may be at least about 3 or 4 times as much accelerator in solution as there is suppressor. In these or other cases, the ratio of accelerator:suppressor may be about 15:1 or less, for example about 10:1 or less, or about 6:1 or less, or about 5:1 or less.

Levelers

While not wishing to be bound by any theory or mechanism of action, it is believed that levelers (either alone or in combination with other bath additives) act as suppressing agents, in some cases to counteract the depolarization effect associated with accelerators, especially in exposed portions of a substrate, such as the field region of a wafer being processed, and at the side walls of a feature. The leveler may locally increase the polarization/surface resistance of the substrate, thereby slowing the local electrodeposition reaction in regions where the leveler is present. The local concentration of levelers is determined to some degree by mass transport. Therefore levelers act principally on surface structures having geometries that protrude away from the surface. This action "smooths" the surface of the electrodeposited layer. It is believed that in many cases the leveler reacts or is consumed at the substrate surface at a rate that is at or near a diffusion limited rate, and therefore, a continuous supply of leveler is often beneficial in maintaining uniform plating conditions over time.

Leveler compounds are generally classified as levelers based on their electrochemical function and impact and do not require specific chemical structure or formulation. However, levelers often contain one or more nitrogen, amine, imide or imidazole, and may also contain sulfur functional groups. Certain levelers include one or more five and six member rings and/or conjugated organic compound derivatives. Nitrogen groups may form part of the ring structure. In amine-containing levelers, the amines may be primary, secondary or tertiary alkyl amines. Furthermore, the amine may be an aryl amine or a heterocyclic amine. Example amines include, but are not limited to, dialkylamines, trialkylamines, arylalkylamines, triazoles, imidazole, triazole, tetrazole, benzimidazole, benzotriazole, piperidine, morpholines, piperazine, pyridine, oxazole, benzoxazole, pyrimidine, quonoline, and isoquinoline. Imidazole and pyridine may be useful in some cases. Other examples of levelers include Janus Green B and Prussian Blue. Leveler compounds may also include ethoxide groups. For example, the leveler may include a general backbone similar to that found in polyethylene glycol or polyethylene oxide, with fragments of amine functionally inserted over the chain (e.g., Janus Green B). Example epoxides include, but are not limited to, epihalohydrins such as epichlorohydrin and epibromohydrin, and polyepoxide compounds. Polyepoxide compounds having two or more epoxide moieties joined together by an ether-containing linkage may be useful in some cases. Some leveler compounds are polymeric, while others are not. Example polymeric leveler compounds include, but are not limited to, polyethylenimine, polyamidoamines, and reaction products of an amine with various oxygen epoxides or sulfides. One example of a non-polymeric leveler is 6-mercapto-hexanol. Another example leveler is polyvinylpyrrolidone (PVP).

Example levelers that may be particularly useful in the context of cobalt deposition include, but are not limited to: alkylated polyalkyleneimines; polyethylene glycol; organic sulfonates; 4-mercaptopyridine; 2-mercaptothiazoline; ethylene thiourea; thiourea; 1-(2-hydroxyethyl)2-imidazolidinethion; sodium naphthalene 2-sulphonate; acrylamide; substituted amines; imidazole; triazole; tetrazole; piperidine; morpholine; piperazine; pyridine; oxazole; benzoxazole; quinolin; isoquinoline; coumarin; butyne 1:4 diol and derivatives thereof. Combinations of these levelers may also be used in some cases.

In certain embodiments, the leveler may be present at a concentration between about 1-10,000 ppm, or between about 10-1,000 ppm, or between about 10-500 ppm. In some cases, the concentration of leveler may be at least about 1 ppm, or at least about 100 ppm. In these or other cases, the concentration of leveler may be about 500 ppm or less, or about 1000 ppm or less.

Bottom-Up Fill

In the bottom-up fill mechanism, a recessed feature on a plating surface tends to be plated with metal from the bottom to the top of the feature. Controlling the deposition rate within the feature and in the field region helps achieve uniform filling and avoid incorporating voids or seams into the features. The three types of additives described above are beneficial in accomplishing bottom-up fill, each working to selectively increase or decrease the polarization at the substrate surface.

After the substrate is immersed in electrolyte, the suppressor adsorbs onto the surface of the substrate, especially in exposed regions such as the field region. At the initial plating stages, there is a substantial differential in suppressor concentration between the top and bottom of a recessed feature. This differential is present due to the relatively large size of the suppressor molecule and its correspondingly slow transport properties. Over this same initial plating time, it is believed that accelerator accumulates at a low, substantially uniform concentration over the plating surface, including the bottom and side walls of the feature. Because the accelerator diffuses into features more rapidly than the suppressor, the initial ratio of accelerator:suppressor within the feature (especially at the feature bottom) is relatively high. The relatively high initial accelerator:suppressor ratio within the feature promotes rapid plating from the bottom of the feature upwards and from the sidewalls inwards. Meanwhile, the initial plating rate in the field region is relatively low due to the lower ratio of accelerator:suppressor. Thus, in the initial plating stages, plating occurs relatively faster within the feature and relatively slower in the field region.

As plating continues, the feature fills with metal and the surface area within the feature is reduced. Because of the decreasing surface area and the accelerator substantially remaining on the surface, the local surface concentration of accelerator within the feature increases as plating continues. This increased accelerator concentration within the feature helps maintain the differential plating rate beneficial for bottom-up fill.

In the later stages of plating, particularly as overburden deposits, the accelerator may build up in certain regions (e.g., above filled features) undesirably, resulting in local faster-than-desired plating. Leveler may be used to counteract this effect. The surface concentration of leveler is greatest at exposed regions of a surface (i.e., not within recessed features) and where convection is greatest. It is believed that the leveler displaces accelerator, increases the local polarization and decreases the local plating rate at regions of the surface that would otherwise be plating at a rate greater than at other locations on the deposit. In other words, the leveler tends, at least in part, to reduce or remove the influence of an accelerating compound at the exposed regions of a surface, particularly at protruding structures. Without leveler, a feature may tend to overfill and produce a bump. Therefore, in the later stages of bottom-up fill plating, levelers are beneficial in producing a relatively flat deposit.

The use of suppressor, accelerator, and leveler, in combination, may allow a feature to be filled without voids from the bottom-up, while producing a relatively flat deposited surface. The exact identity/composition of the additive compounds are typically maintained as trade secrets by the additive suppliers, thus, information about the exact nature of these compounds is not publicly available.

In certain embodiments where cobalt is electroplated into recessed features, the features may have a width between about 10-150 nm, or between about 15-100 nm. In some cases the features have a width no greater than about 30 nm. In these or other cases, the features may have a depth between about 30-100 nm, or between about 50-200 nm. Example aspect ratios may be between about 2-20 in various embodiments. The aspect ratio of a recessed feature is measured as the depth of the feature divided by the width of the feature near its opening. In other words, an aspect ratio of 5 represents a height to width ratio of 5/1 (depth/width), also sometimes represented as 5:1 (depth:width).

As noted above, in certain embodiments, particular suppressors or accelerators may be used. In some cases, a particular combination of suppressors or accelerators may be used. One example combination is polyethyleneimine (PEI) as suppressor and 3-mercapto-1-propane sulfonic acid sodium salt (MPS) as accelerator. Another example combination is PEI as suppressor and thiourea as accelerator.

FIGS. 3A-3D are focused ion beam scanning electron microscope (FIB/SEM) images showing the results of a cobalt electroplating process where cobalt is electroplated into recessed features using various suppressor/accelerator additive packages. The recessed features had a width of about 25 nm, and included a 50 Å thick cobalt seed layer. The substrate in FIG. 3A was plated in electrolyte that included PEI as suppressor and MPS as accelerator. The substrate in FIG. 3B was plated in electrolyte that included PEI as suppressor and thiourea as accelerator. The features shown in FIGS. 3A and 3B were plated in a bottom-up manner, and no seams or voids are visible in the features. By contrast, the features shown in FIGS. 3C and 3D were plated in a conformal manner, as shown by the vertically oriented seams that formed when the conformally plated sidewalls closed in toward one another. The substrate in FIG. 3C was plated in electrolyte that included PEI as suppressor and tetraisothiuramdisulfide (TIS) as accelerator, and the substrate in FIG. 3D was plated in electrolyte that included PEI as suppressor and diphenyldisulfide (DPS) as accelerator. The alternative disulfide accelerators used in FIGS. 3C and 3D yielded an entirely conformal fill behavior.

Figure 4A:
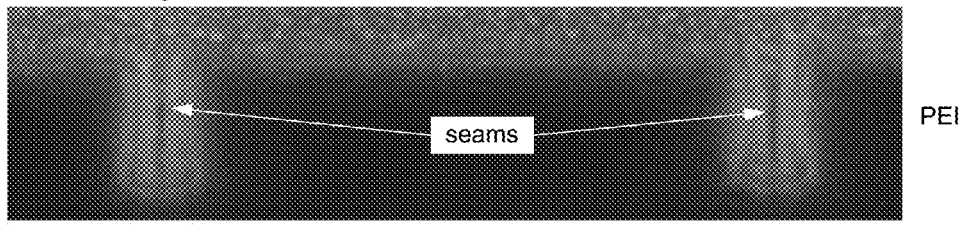
FIGS. 4A-4D depict recessed features filled with cobalt using various combinations of additives.
Figure 4B:

FIGS. 4A and 4B show FIB/SEM images of substrates having recessed features electroplated with cobalt using two different electrolyte solutions. The recessed features had a width of about 25 nm, and had a 50 Å thick cobalt seed layer. The substrate in FIG. 4A was electroplated in electrolyte that included PEI as suppressor, without any accelerator present.

Figure 4C:
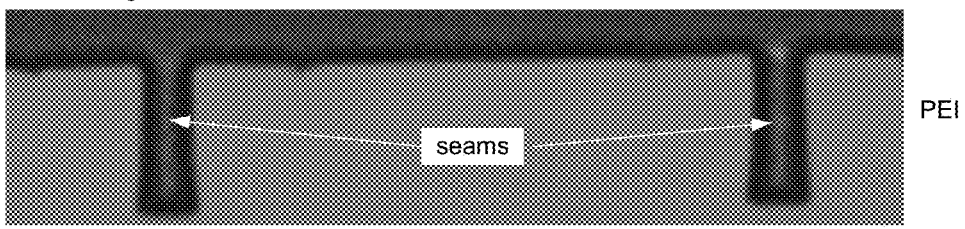
Figure 4D:
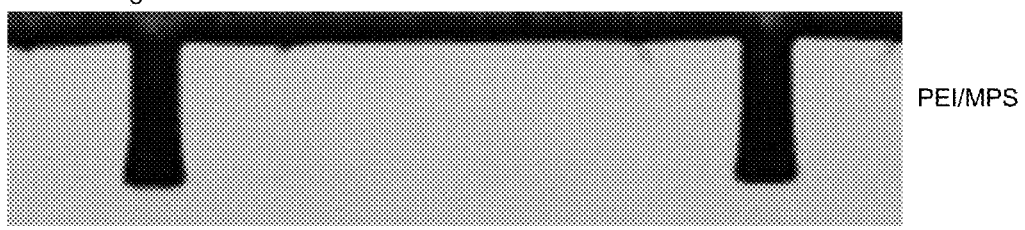
Figure 5A:
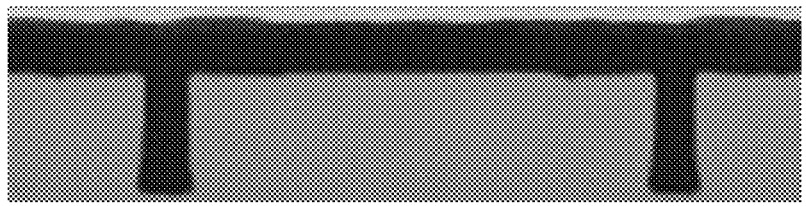
FIGS. 5A-5D depict recessed features filled with cobalt using various combinations of additives and current densities.
Figure 5B:
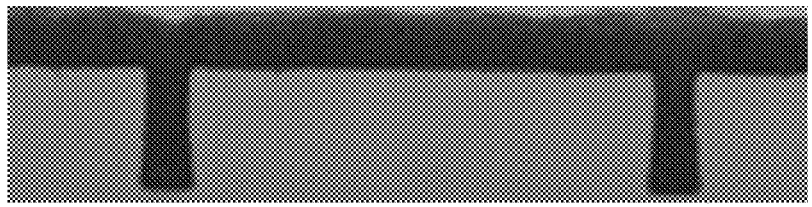
Figure 5C:
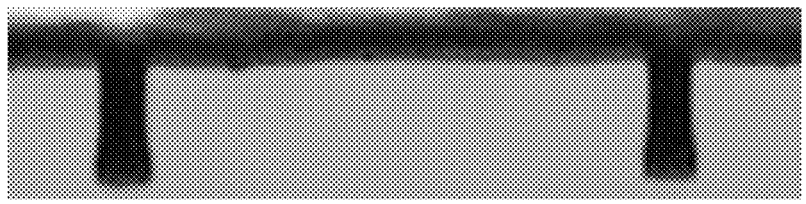
Figure 5D:
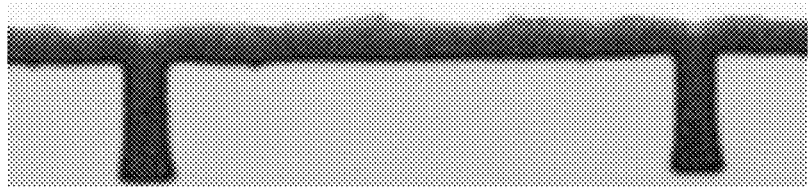

The substrate in FIG. 4B was electroplated in electrolyte that included PEI as suppressor and MPS as accelerator. FIGS. 4C and 4D show STEM images of a substrate having recessed features filled with cobalt using the two different electrolyte solutions described in relation to FIGS. 4A and 4B. Specifically, the substrate in FIG. 4C was electroplated in electrolyte that included PEI as suppressor, without any accelerator present (much like the substrate of FIG. 4A), and the substrate in FIG. 4D was electroplated in electrolyte that included PEI as suppressor and MPS as accelerator (much like the substrate of FIG. 4B). FIGS. 4A-4D show that the MPS acts as accelerator to increase the fill rate and promote a bottom-up growth mechanism.

FIGS. 5A-5D show STEM images of substrates having recessed features plated with cobalt in electrolytes containing various concentrations of different plating additives. The recessed features had a width of about 25 nm and included a 50 Å thick seed cobalt seed layer. These figures show very high quality fill results. The substrate in FIG. 5A was plated in electrolyte including about 30 ppm PEI as suppressor and about 150 ppm MPS as accelerator. The substrate in FIG. 5A was plated at a current density of about 1.6 mA/cm2. The substrate in FIG. 5B was plated in electrolyte having the same composition as that of FIG. 5A, though a higher current density of about 6.3 mA/cm2 was used. The substrate in FIG. 5C was plated in electrolyte including about 30 ppm PEI as suppressor and about 300 ppm MPS as accelerator. The substrate in FIG. 5C was plated at a current density of about 1.5 mA/cm2. As compared to the electrolyte used in connection with FIGS. 5A and 5B, the electrolyte used in FIG. 5C had twice as much accelerator. The substrate in FIG. 5D was plated in electrolyte that included 30 ppm PEI as suppressor and about 400 ppm thiourea as accelerator. The substrate in FIG. 5D was plated at a current density of about 1.6 mA/cm2. The results of FIGS. 5A-5D all show high quality cobalt electroplating. The plating results in FIGS. 5A and 5B were especially high quality.

The waveform used to electroplate can also affect the bottom-up plating mechanism. The optimal range of potential and current density will depend on the substrate and on the concentration of cobalt and additives in the electrolyte. In general, current efficiency increases with current density. However, when electroplating additives are used (e.g., suppressor, accelerator, etc.), the current density may be kept within a hysteresis window as a result of the additives. The sheet resistance of the substrate can also affect the optimal potential, with more resistive films generally plating at relatively higher potentials. In one example where a relatively resistive substrate is used (e.g., the substrate initially having a resistance of at least about 200 $\Omega/cm^2$) in electrolyte having about 3 g/L cobalt ions, the current density may range between about 3-4 mA/cm$^2$ at between about 1.7-2.1 V vs. an HgSO$_4$ mercury sulfate reference electrode. This range presents only one example, and may be extended in either direction, particularly where a different substrate or electrolyte composition is used. In certain cases, for instance, a constant current density may be used during part or all of the electroplating process. The current density may be kept constant at a current density between about 1-7 mA/cm$^2$ in some embodiments. Further details related to possible waveforms/techniques that may be used during electroplating are discussed below.

Rough vs. Smooth Film Deposition

Another problem that is sometimes encountered when electroplating cobalt is that the resulting cobalt film is undesirably rough. For example, when cobalt is plated onto a cobalt seed layer using a cobalt-based virgin makeup solution (VMS) using common additive packages, result in films that are quite rough. Without wishing to be bound by theory or mechanism of action, it is believed that this roughness may result from unfavorable interactions/wetting of the organic additives with the cobalt surface, which affects the way that a deposited film nucleates/spreads.

The surface on which deposition occurs can have a large effect on the roughness of the resulting film. This surface may be a seed layer, or it may be another material that forms the substrate. For the sake of simplicity, the surface on which deposition occurs will be referred to as a seed layer. Seed layers that are relatively more resistive typically result in relatively rougher films. This difference may arise due to the fact that when a more resistive seed layer is present, plating typically occurs at a more negative substrate polarization. At the more negative potential/greater polarization levels, there is a higher degree of hydrogen evolution, which creates bubbles and can promote a relatively rougher film.

Cobalt seed layers may have a resistance between about 100-500 $\Omega/cm^2$, and typically lead to rougher films than copper seed layers, which often have a sheet resistance around 20 $\Omega/cm^2$. Where copper seed layers are used, a plating voltage may be around −0.5 V with respect to a HgSO$_4$ mercury sulfate reference electrode. By contrast, where cobalt seed layers are used, a total plating potential may be between about −1.0 and −3.5 V, for example between about −1.5 and −2.5 V, or between about −1.8 and −2.0 V with respect to a HgSO$_4$ mercury sulfate reference electrode. These voltages are particularly relevant for embodiments where plating occurs on a relatively thin seed layer. In some embodiments, the seed layer is between about 10-100 Å thick, for example between about 15-30 Å thick, or between about 30-50 Å thick. In these or other cases, the seed layer may be about 100 Å thick or less, for example about 50 Å thick or less. The more negative voltage and greater polarization leads to smoother film on copper seed layers and rougher film on cobalt seed layers. This difference in roughness holds regardless of the metal being plated on the seed layer. While copper seed layers may lead to smoother films, copper seed layers may not be appropriate for certain embodiments. For instance, it may be possible to deposit a cobalt seed layer in certain cases where a high quality copper seed layer cannot be deposited.

Figure 6A:
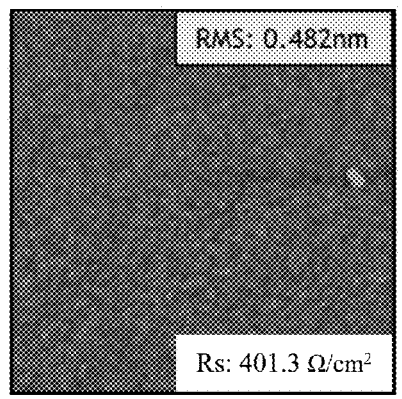
FIGS. 6A-6D and 7A-7D show substrates plated with cobalt, highlighting the roughness and sheet resistance of each film.
Figure 6B:
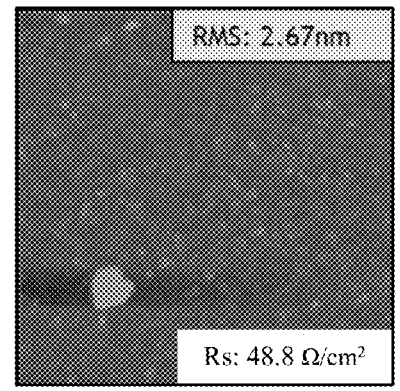
Figure 6C:
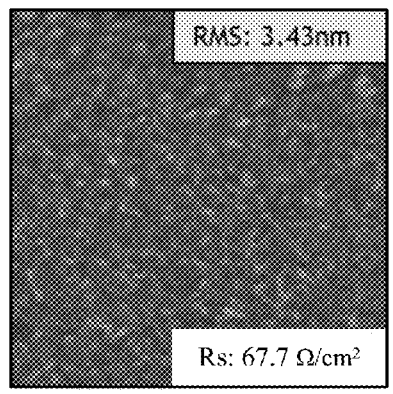
Figure 6D:
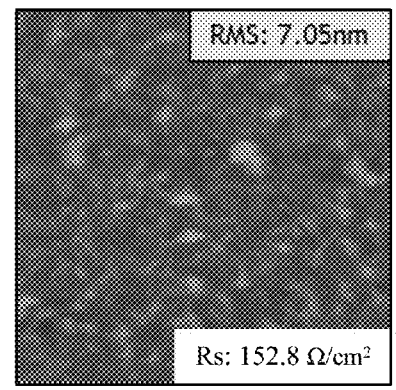
Figure 7A:
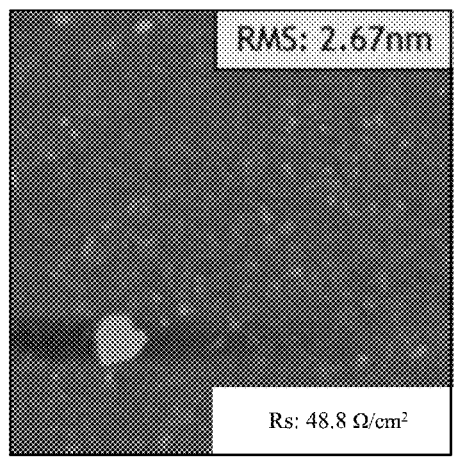
Figure 7B:
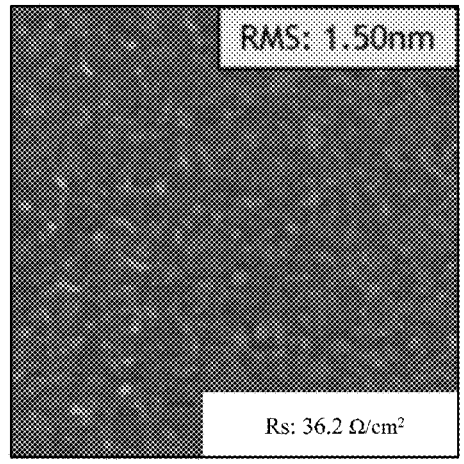
Figure 7C:
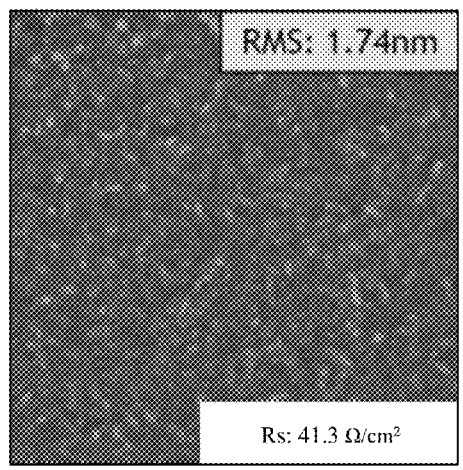
Figure 7D:
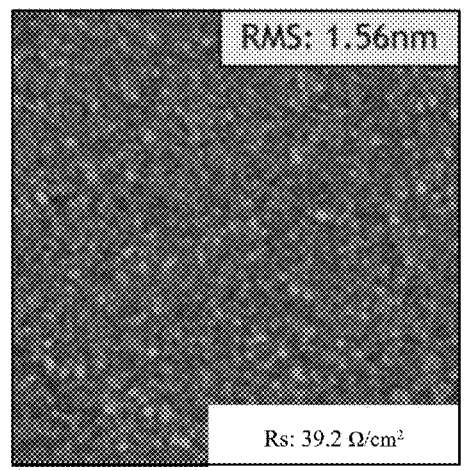

FIGS. 6A-6D present images and typical RMS roughness values for various cobalt substrates/films. In particular, FIG. 6A shows a blank substrate with a 30 Å blanket of cobalt, FIG. 6B shows a 10 nm cobalt film plated in cobalt-based VMS on the 30 Å blanket of cobalt, FIG. 6C shows a 10 nm cobalt film plated in cobalt-based VMS with an accelerator (MPS accelerator) on the 30 Å blanket of cobalt, and FIG. 6D shows a 10 nm cobalt film plated from cobalt-based VMS with both accelerator (MPS) and suppressor (PEI suppressor) on the 30 Å blanket of cobalt. The RMS (root mean square) values recited relate to the roughness of the deposited film, with higher RMS values indicating relatively rougher films. The blank 30 Å cobalt substrate of FIG. 3A has an RMS value of only about 0.5 nm, whereas the cobalt film plated in VMS of FIG. 3B has an RMS value of about 2.7, the cobalt film plated in VMS with accelerator has an RMS value of about 3.4, and the cobalt film plated in VMS with accelerator and suppressor has an RMS value of over 7.0. In other words, the use of typical plating additives, especially suppressor, can result in very rough films. The addition of suppressor and accelerator to the plating solution increased the roughness by a factor of about 2.5. Further, the sheet resistance of the plated films also rose, from about 50 $\Omega/cm^2$ in FIG. 6B, to about 68 $\Omega/cm^2$ in FIG. 6C, and about 153 Ω/cm² in FIG. 6D. Sheet resistance increases along with the roughness of the plated film.

The roughness of a cobalt film can be minimized by electroplating the film in electrolyte having certain additives. Levelers, wetting agents, and brighteners can all promote smoother films. Levelers can help promote uniform/continuous nucleation (and therefore a smooth film) by encouraging nucleation at regions of the seed layer that are relatively depressed compared to surrounding regions, thereby counteracting the effect of a relatively rough seed layer. Further, levelers act to promote deposition in hollow regions compared to peak regions as deposition continues, thereby leveling the surface and depositing a smoother film. Appropriate levelers for electroplating cobalt are described above in the section related to conformal vs. bottom-up fill.

Wetting agents, sometimes referred to as surfactants, can be added to the electrolyte to enhance the wetting behavior on the substrate and thereby prevent pitting. Suitable wetting agents in the context of cobalt deposition include, but are not limited to: alkyl phenoxy polyethoxyethanols; compounds of polyoxyethylene and polyethyleneglycol polymers; and block and random copolymers of polyoxyethylene and polyoxypropylene. In certain embodiments, the wetting agent may be present at a concentration between about 1-10,000 ppm, for example between about 100-1000 ppm. In some embodiments, the concentration of leveler is at least about 1 ppm, or at least about 100 ppm. In these or other embodiments, the concentration of leveler may be about 5000 ppm or less, for example about 1000 ppm or less.

Brightening agents may also be added to the electrolyte to achieve a high plating rate and a high quality, smooth/bright film having optimal luster. Suitable brightening agents in the context of cobalt deposition include, but are not limited to: 3-sulfanyl-1-propane sulfonate (MPS, also referred to as 3-mercapto-1-propane sulfonic acid sodium salt); 2-mercapto-ethane sulfonic acid sodium salt; bisulfopropyl disulfide; N,N-dimethyldithiocarbamic acid ester sodium salt; (o-ethyldithiocarbonato)-S-(3-sulfurpropyl)-ester potassium salt; 3-[(amino-iminomethyl)-thio]-1-propane sulfonic acid sodium salt; phenolphthalein; lactone; lactams; cyclic sulfate esters; cyclic imides; cyclic oxazolinones; assymetrical alkyne sulfonic acids; (N-substituted pyridyl)-alkyl sulfonic acid betaines; amino polyarylmethanes; pyridine derivatives; quinoline derivatives; and sulfonated aryl aldehydes. In certain implementations, a brightening agent may be present in electrolyte at a concentration between about 1 ppb and 1 g/L, or between about 10 ppb-100 ppm. In some embodiments, the brightening agent is present at a concentration of at least about 1 ppb, for example at least about 10 ppb. In these or other cases, the brightening agent may have a concentration of about 100 ppm or less, for example about 10 ppm or less.

Certain species may serve the purpose of more than one type of additive as described herein. For instance, 3-sulfanyl-1-propane sulfonate (MPS) can act as both an accelerator and as a brightener, and thiourea can act as both an accelerator and as a leveler. In some cases where a particular chemical species present in electrolyte is capable of performing the function of two different types of additives, one or more additional additive species may be used to supplement the function of one or both of these types of additives. For example, the electrolyte may include PEI (which acts as a suppressor), thiourea (which acts as an accelerator and as a leveler), and imidazole (which also acts as a leveler).

FIGS. 7A-7D illustrate the effect of including a leveling agent (in this case polyethylene glycol, PEG 1000, available from Sigma-Aldrich of St. Louis, Mo.) at various concentrations in the electrolyte. The substrate shown in FIG. 7A was electroplated with cobalt in a cobalt-based virgin makeup solution (VMS). The substrate shown in FIG. 7B was electroplated in the cobalt-based VMS used in relation to FIG. 7A, with the addition of 10 ppm PEG 1000 as a leveler. The substrate shown in FIG. 7C was plated in the cobalt-based VMS with 100 ppm PEG 1000. The substrate shown in FIG. 7D was plated in the cobalt-based VMS with 300 ppm PEG 1000. The substrates that were plated with electrolyte including the leveler species showed substantially lower RMS roughness values. In particular, the RMS values decrease by about half when the leveler was present in the electrolyte. The decrease in roughness also corresponds to a decrease in resistance of the plated film.

Pre-Treatment of Seed Layer

In order to electroplate material onto a substrate, the substrate is typically provided with a conductive seed layer thereon. The seed layer is often deposited by physical vapor deposition (PVD), atomic layer deposition (ALD), or chemical vapor deposition (CVD). In many cases this seed layer can become oxidized, which deleteriously affects the electroplating process and results. For example, an oxidized seed layer can result in a very rough electroplated film, and in some cases can result in failure of an electroplating process. Such oxidation may result from a reaction between the seed layer and oxygen or water vapor present in the atmosphere to which the substrate is exposed. The oxidized layer is often fairly thin. However, even a thin layer of oxide can represent a significant fraction (or even the entire thickness) of the thin seed layers used in current technology nodes.

Oxidized seed layers are problematic for several reasons. First, an oxidized surface is difficult to plate on. Due to different interactions that electroplating bath additives can have on metal oxide and pure metal, non-uniform plating may result. Similarly, as a result of the differences in conductivity between a metal oxide and a pure metal, non-uniform plating may result. Second, voids may form in the metal seed that may make portions of the metal seed unavailable to support plating. The voids may form as a result of dissolution of metal oxide during exposure to corrosive plating solutions. The voids also may form on the surface due to non-uniform plating. Additionally, plating bulk metal on top of an oxidized surface can lead to adhesion or delamination problems, which can further lead to voids following subsequent processing steps, such as chemical mechanical planarization (CMP). Third, metal oxide formation may impede post-electrodeposition steps, such as capping, where the metal oxide may limit adhesion for capping layers.

After depositing a metal seed layer but prior to electroplating a bulk metal on the seed layer, it may be difficult to avoid formation of metal oxide on the metal seed layer. Various steps occur prior to electroplating the metal that may expose the metal seed layer to oxygen or water vapor in ambient conditions. Further, the seed layer can include impurities (e.g., carbon) that tend to render the seed layer more insulating, and therefore more challenging to plate on. In order to achieve optimal plating results, the cobalt seed layer may be treated prior to electroplating to reduce the surface oxide and remove carbon impurities. The carbon impurity issue is particularly relevant when plating on a cobalt seed layer. Copper seed layers can easily be deposited without any carbon impurities. As such, there is a greater need for such pre-treatment processes where a cobalt seed layer is used, especially where the cobalt seed layer is deposited through CVD or ALD, where the likelihood of having carbon impurities in the seed layer is particularly high.

Two pre-treatment methods for reducing surface oxide and removing impurities in the seed layer are described herein. One pre-treatment method relates to a hydrogen-radical based process, where metal oxide on the seed layer is reduced by hydrogen radicals that form from decomposition of a pure $H_2$ gas (or another H-containing gas) in another carrier gas (e.g., He, Ar, $N_2$, etc.) in a plasma. The plasma may be produced remotely from the substrate. The second pre-treatment method described herein relates to an anneal process that may be done while exposing the substrate to forming gas. Any of the embodiments herein may be practiced with either or both of these pre-treatment methods.

Plasma Pre-Treatment

Figure 8:
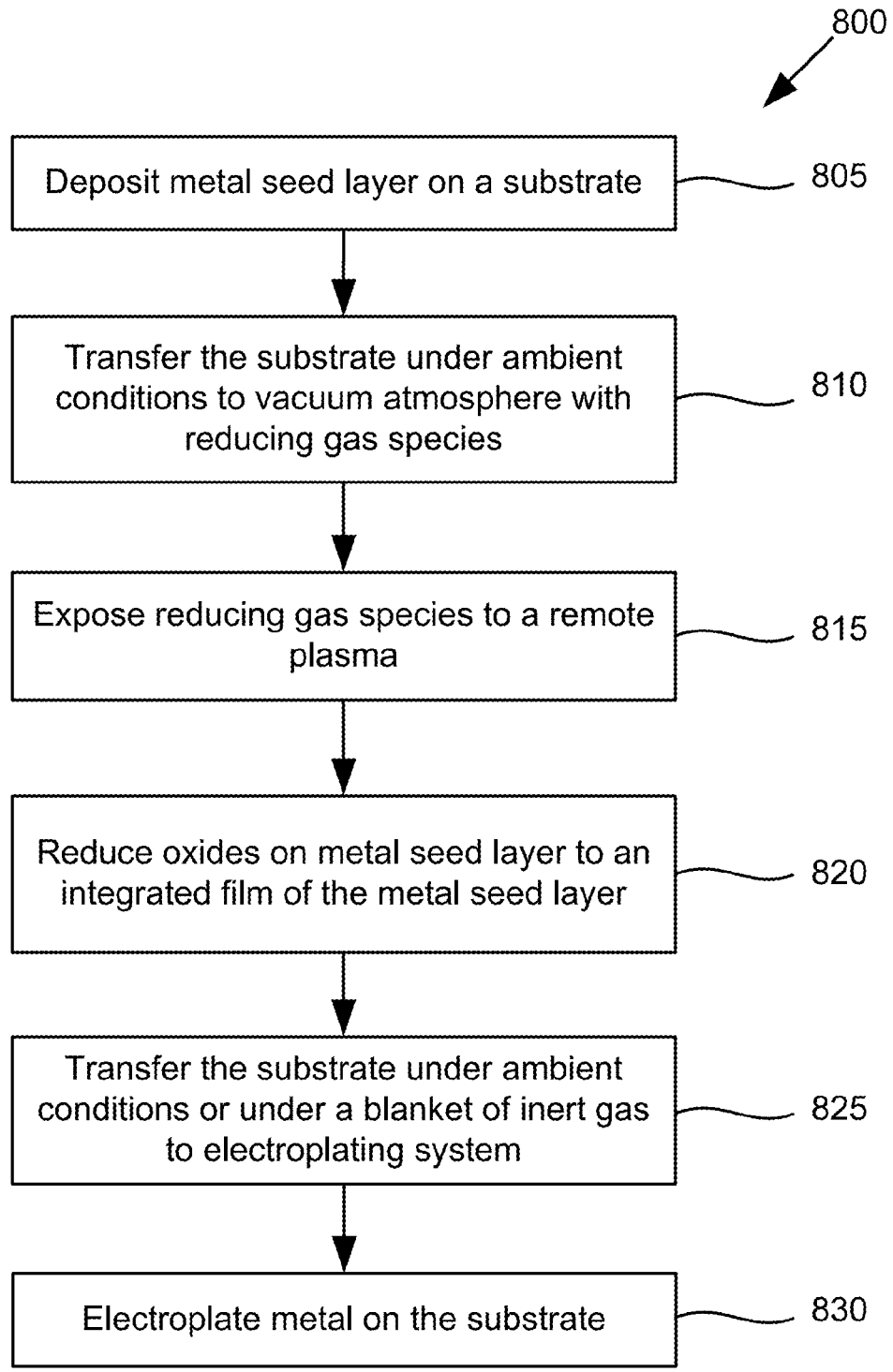
FIG. 8 shows a flow chart for a method of pre-treating a cobalt seed layer using a remote plasma.

FIG. 8 shows an example flow chart illustrating a method of reducing oxides on a metal seed layer and plating metal on a substrate. The process 800 can begin with step 805 where a metal seed layer such as a thin cobalt layer is deposited on a substrate. This provides a substrate having the metal seed layer on a plating surface of the substrate. The substrate may have recesses having height to width aspect ratios of greater than about 3:1 or about 5:1 in some embodiments.

Step 805 can occur in a deposition apparatus such as a PVD apparatus, an ALD apparatus, or a CVD apparatus. The process 800 can continue with step 810 where the substrate is transferred to a chamber or apparatus having a substantially reduced pressure or vacuum environment. The chamber or apparatus can include a reducing gas species. In some embodiments, the reducing gas species can include hydrogen ($H_2$), ammonia ($NH_3$), carbon monoxide (CO), diborane ($B_2H_6$), sulfite compounds, carbon and/or hydrocarbons, phosphites, and/or hydrazine ($N_2H_4$), or any combination thereof. During the transfer in step 810, the substrate may be exposed to ambient conditions that can cause the surface of the metal seed layer to oxidize. Thus, at least a portion of the metal seed layer may be converted to an oxidized metal.

At step 815, while the substrate is in the reduced or vacuum environment, the reducing gas species may be exposed to a remote plasma. The remote plasma may generate radicals of the reducing gas species, such as, for example, $H^*$, $NH_2^*$, or $N_2H_3^*$. The radicals of the reducing gas species react with the metal oxide surface to generate a pure metallic surface. Equation 1, below, shows an example of a reducing gas species (hydrogen gas) being broken down into hydrogen radicals. Equation 2 shows the hydrogen radicals reacting with the metal oxide surface to convert the metal oxide to metal. For hydrogen gas molecules that are not broken down or hydrogen radicals that recombine to form hydrogen gas molecules, the hydrogen gas molecules can still serve as a reducing agent for converting the metal oxide to metal, as shown in Equation 3.

$H_2 \rightarrow 2H^*$  Equation 1:

$(x)2H^* + MOx \rightarrow M + (x)H_2O$  Equation 2:

$xH_2 + MOx \rightarrow M + xH_2O$  Equation 3:

The radicals of the reducing gas species or the reducing gas species itself may react with the metal oxide under conditions that convert the metal oxide to metal in the form of a film integrated with the metal seed layer, as shown in step 820.

The process conditions for converting the metal oxide to metal in the form of a film integrated with the metal seed layer can vary depending on the choice of metal and/or on the choice of the reducing gas species. In some embodiments, the reducing gas species can include at least one of $H_2$, $NH_3$, CO, carbon and/or hydrocarbons, $B_2H_6$, sulfite compounds, phosphites, and $N_2H_4$. In addition, the reducing gas species can be combined with mixing gas species, such as relatively inert gas species. Examples of relatively inert gas species can include nitrogen ($N_2$), helium (He), neon (Ne), krypton (Kr), xenon (Xe), radon (Rn), and argon (Ar). The flow rate of the reducing gas species can vary depending on the size of the wafer for processing. For example, the flow rate of the reducing gas species can be between about 10 standard cubic centimeter per minute (sccm) and about 100,000 sccm for processing a single 450 mm wafer. Other wafer sizes can also be used. For example, the flow rate of the reducing gas species can be between about 500 sccm and about 30,000 sccm for processing a single 300 mm wafer.

Processing conditions such as temperature and pressure in the reducing chamber can also be controlled to permit conversion of the metal oxide to metal in the form of a film integrated with the metal seed layer. In some embodiments, the temperature of the reducing chamber can be relatively high to permit the dissociation of reducing gas species into radicals. For example, the reducing chamber can be anywhere between about 10-500° C., such as between about 100-300° C., or between about 200-300° C. In a particular example the chamber is maintained at a temperature of about 250° C. Higher temperatures may be used to speed up metal oxide reduction reactions and shorten the duration of exposure to the reducing gas atmosphere. In some embodiments, the reducing chamber can have a relatively low pressure to substantially remove any oxygen from the reducing gas atmosphere, since minimizing the presence of oxygen in the atmosphere can reduce the risk of reoxidation. For example, the reducing chamber can be pumped down to a vacuum environment or a reduced pressure of between about 0.1 Torr and about 50 Torr, for example between about 0.1-10 Torr, or between about 0.1-5 Torr.

Although the reducing chamber can have a relatively high temperature to permit the dissociation of reducing gas species into radicals, the temperature of the substrate itself may be separately controlled to avoid or reduce damage to the metal seed layer. The metal can begin to agglomerate above a threshold temperature. The effects of agglomeration are more pronounced in relatively thin seed layers, especially in seed layers having a thickness less than about 100 Å. Agglomeration includes any coalescing or beading of a continuous or semi-continuous metal seed layer into beads, bumps, islands, or other masses to form a discontinuous metal seed layer. This can cause the metal seed layer to peel away from the surface upon which it is disposed and can lead to increased voiding during plating. For example, the temperature at which agglomeration begins to occur in copper is greater than about 100° C., and the temperature at which agglomeration begins to occur in cobalt is about 500° C. Different agglomeration temperatures may be appropriate for different metals.

To control the temperature of the substrate and avoid or reduce the effects of agglomeration, a cooling system such as an actively cooled pedestal and/or gas flow cooling apparatus in the reducing chamber can be used to keep the local area of the substrate at temperatures below the agglomeration temperature. In some embodiments, the substrate may be supported upon and directly in contact with the pedestal. In some embodiments, a gap may exist between the pedestal and the substrate. Heat transfer can occur via conduction, convection, radiation, or combinations thereof.

The duration of exposure to the reducing gas atmosphere can vary depending on the other process parameters. For example, the duration of exposure to the reducing gas atmosphere can be shortened by increasing remote plasma power, temperature of the reducing chamber, etc. In certain embodiments, the duration of the exposure to reduce the metal oxide surfaces to pure metal in an integrated film with the metal seed layer can be between about 1 second and about 60 minutes. For example, for pretreatment of cobalt seed layers, the duration of the exposure can between about 10-300 seconds, for example between about 60-120 seconds.

At step 825 in FIG. 8, the substrate may be transferred under ambient conditions or under a blanket of inert gas to the electroplating system or other pretreating apparatus. Though metal oxides in the metal seed layer have been substantially reduced by exposing the metal oxide surfaces to a reducing gas atmosphere, performing step 825 may present an additional challenge of reoxidation from exposure to the ambient environment. In some embodiments, exposure to ambient conditions may be minimized using techniques such as shortening the duration of transfer or controlling the atmosphere during transfer. Additionally or alternatively, the transfer is conducted in a controlled environment that is less oxidizing than ambient conditions. To control the atmosphere during transfer, for example, the atmosphere may be substantially devoid of oxygen. The environment may be substantially inert and/or be low pressure or vacuum. In some embodiments, the substrate may be transferred under a blanket of inert gas. As discussed below, the transfer in step 825 may occur from a remote plasma apparatus to an electroplating system, where the remote plasma apparatus is integrated or otherwise connected to the electroplating system. At step 830, metal may be electroplated on to the substrate.

The remote plasma pre-treatment may result in a reduction in sheet resistance, as described further below. In some embodiments, the sheet resistance is reduced by at least about 15%, for example at least about 25%, at least about 50%, or at least about 70%. In these or other cases, the sheet resistance of the seed after the remote plasma pre-treatment process may be between about 50-1000 $\Omega/cm^2$, or between about 100-500 $\Omega/cm^2$. As noted below, the drop in resistance depends at least in part on the method used to deposit the seed layer.

This pre-treatment step is further discussed and described in U.S. patent application Ser. No. 14/020,339, filed Sep. 6, 2013, and titled "METHOD AND APPARATUS FOR REMOTE PLASMA TREATMENT FOR REDUCING METAL OXIDES ON A METAL SEED LAYER," which is herein incorporated by reference in its entirety.

Anneal Pre-Treatment

The second pre-treatment process mentioned above relates to an anneal process. A substrate having a seed layer thereon may be exposed to a reducing gas (e.g., $H_2$, $NH_3$, CO, carbon and/or hydrocarbons, $B_2H_6$, sulfite compounds, phosphites, $N_2H_4$, and combinations thereof) flowed in with an inert carrier gas (e.g., nitrogen ($N_2$), helium (He), neon (Ne), krypton (Kr), xenon (Xe), radon (Rn), argon (Ar), and combinations thereof) at an elevated temperature. In various cases the substrate is exposed to forming gas, which is a mixture of $H_2/N_2$. In some examples, the chamber in which the anneal occurs may be maintained between about 75-400° C., or between about 75-350° C., or between about 300-400° C., or between about 325-375° C. The temperature of the anneal may be at least about 75° C., at least about 150° C., or at least about 300° C. in some cases. In these or other cases, the temperature of the anneal may be about 400° C. or less, about 350° C. or less, or about 300° C. or less. In a particular embodiment the chamber is maintained at a temperature of about 350° C. during the anneal. The pressure in the chamber may be maintained between about 0.5-3 Torr, for example between about 1-1.5 Torr. The reducing gas may flow into the reaction chamber at a rate between about 10-30,000 sccm, for example between about 500-30,000 sccm. Such flow rates are relevant for processing on a 300 mm diameter substrate, and may be adjusted as appropriate for substrates of other sizes. The flow rates may scale linearly based on substrate area. The anneal process may have a duration between about 30-300 s, for example between about 60-120 s.

As with the plasma treatment described above, agglomeration of the seed layer may occur under certain conditions. The risk of agglomerations is higher at relatively higher substrate temperatures. In some cases, the substrate itself may be cooled during the anneal to prevent agglomeration as described above. In various other cases, the substrate temperature remains sufficiently low during the anneal (without any active cooling of the substrate) that agglomeration is not an issue.

The anneal pre-treatment may result in a reduction in sheet resistance, as described further herein. In some embodiments, the sheet resistance is reduced by at least about 15%, for example at least about 25%, at least about 50%, or at least about 70%. In these or other cases, the sheet resistance of the seed after the anneal process may be between about 15-1000 $\Omega/cm^2$, or between about 100-500 $\Omega/cm^2$. As noted below, the drop in resistance depends at least in part on the method used to deposit the seed layer.

The anneal may occur in a dedicated anneal chamber, or it may occur in a processing chamber that is configured to perform other functions. In one example, the anneal may be performed in the same chamber that is used to deposit the seed layer. Regardless of where the anneal occurs, the substrate may be transferred to the electroplating apparatus under conditions that prevent re-oxidation of the seed layer. Such conditions/techniques are described above. One possible apparatus for performing an anneal process is further described in U.S. patent application Ser. No. 14/069,220, which is herein incorporated by reference in its entirety.

Figure 9:
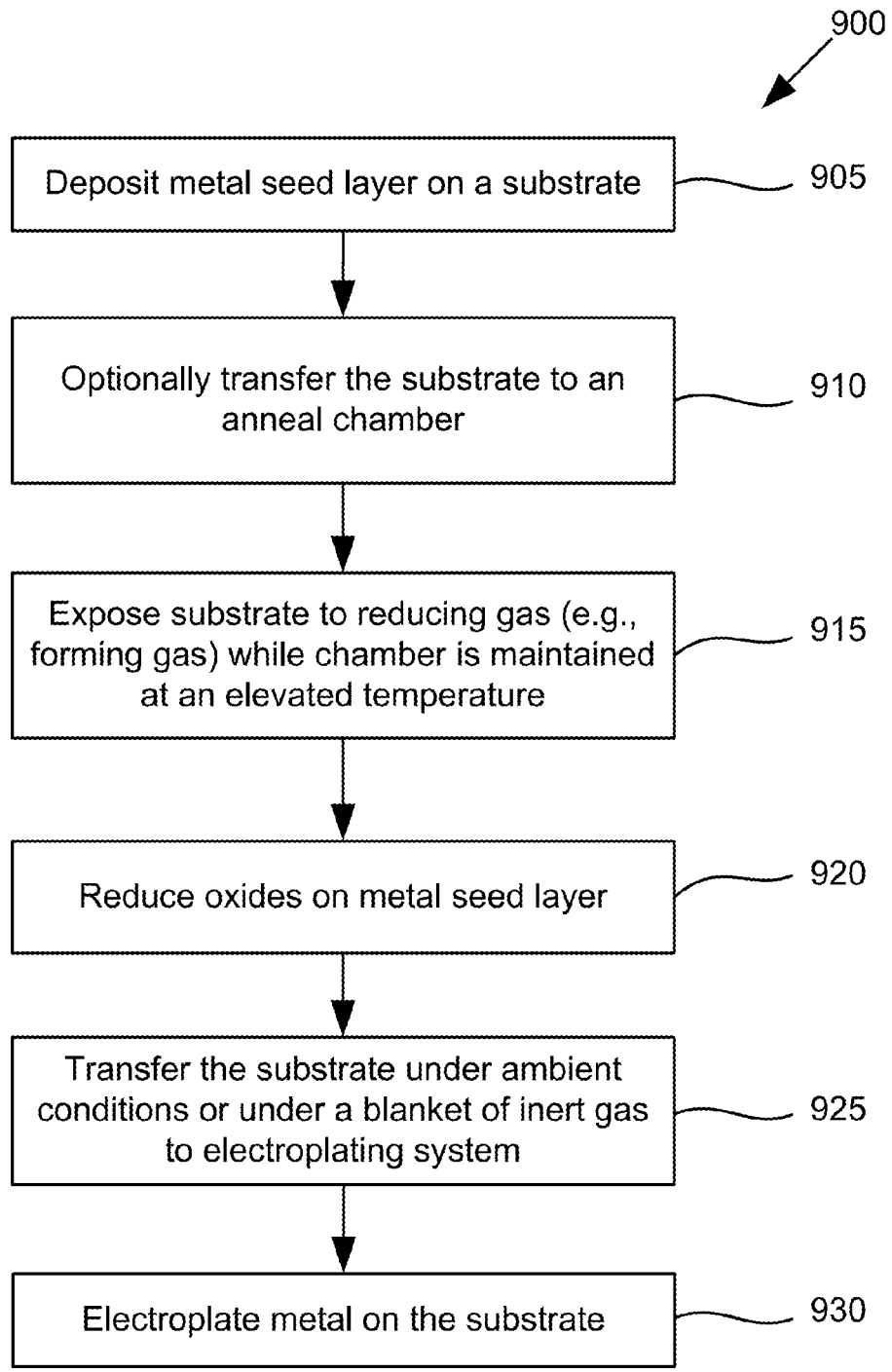
FIG. 9 shows a flow chart for a method of pre-treating a cobalt seed layer using an anneal process.

FIG. 9 presents a flow chart for one method of depositing a seed layer, performing an anneal process to pre-treat the seed layer, and electroplate material on the substrate. The method 900 begins at operation 905, where the seed layer is deposited. Operation 905 corresponds to operation 805 of FIG. 8, and for the sake of brevity the description will not be repeated. At operation 910 the substrate may be optionally transferred to an anneal chamber where the anneal process will take place. Alternatively, the anneal process may occur in the same chamber where the seed layer is deposited. Where the anneal occurs in a different chamber than the seed deposition, the substrate transfer to the anneal chamber is typically conducted under ambient conditions, since the anneal will reduce any oxides that form during the transfer. Next, at operation 915, the substrate is exposed to a reducing gas (e.g., forming gas) while being subjected to an elevated temperature as described above. This exposure to reducing gas results in reduction of oxides on the metal seed layer and removal of carbon impurities from the seed layer, as described in operation 920. At operation 925, the substrate may be transferred from the chamber in which the anneal occurred to an electroplating system. This transfer may occur under ambient conditions in some cases, though in other cases the transfer occurs in a controlled atmosphere as described above with respect to the plasma pre-treatment. The controlled atmosphere can minimize the risk of re-oxidizing the seed layer. Next, at operation 930, the substrate is electroplated.

Anneal pre-treatment processes are further discussed in the context of copper seed layers in U.S. Pat. No. 8,703,615, which is herein incorporated by reference in its entirety. Various details disclosed in the context of a copper seed layer may also apply when treating a cobalt seed layer.

Effects of Pre-Treatment Processes

The pre-treatment processes described herein result in both (a) reduction of oxidized material on the seed layer, and (b) removal of carbon impurities from the seed layer. One effect of these processes is a reduction in the sheet resistance of the seed layer.

Figure 10:
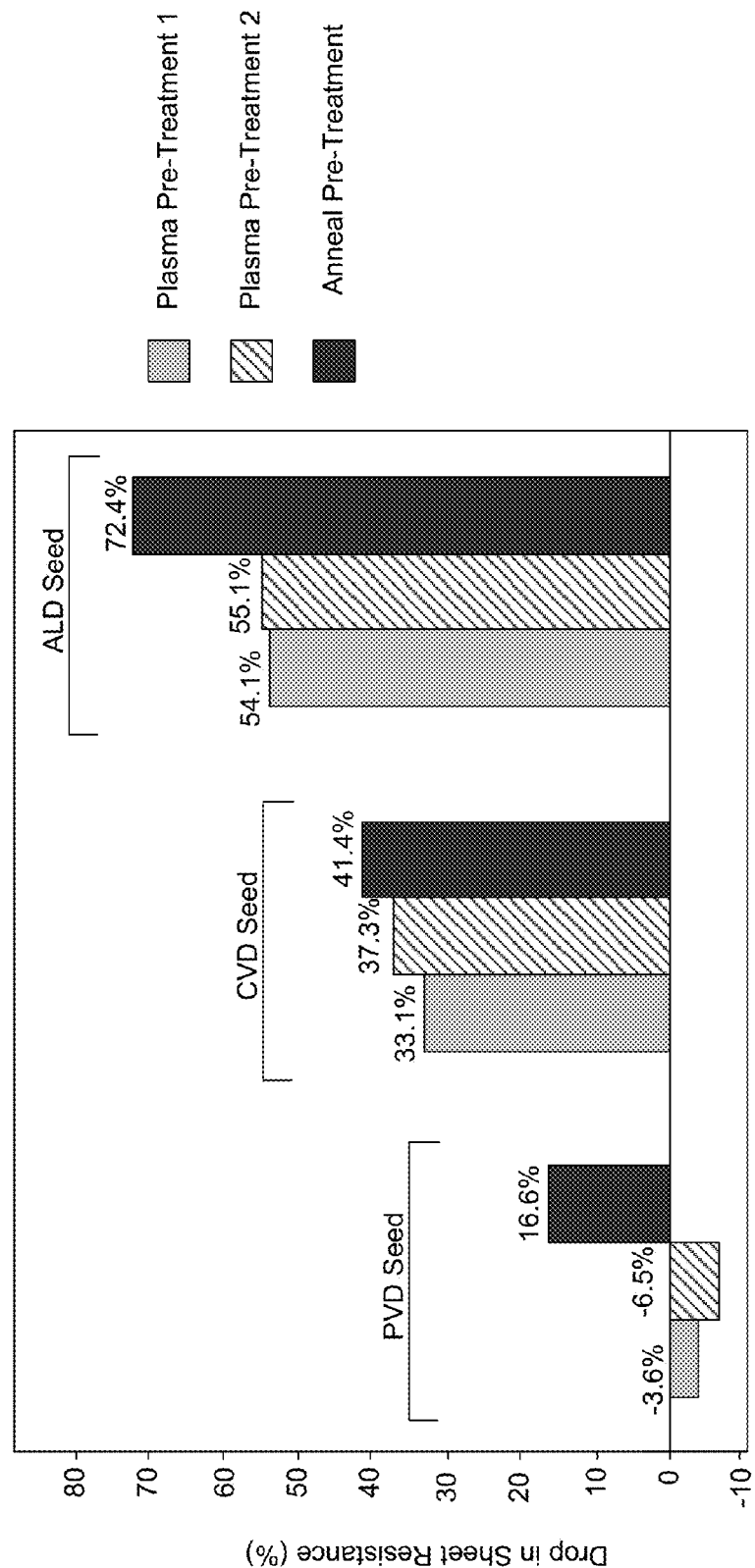
FIG. 10 is a graph showing the drop in sheet resistance for various types of cobalt seed layers after the substrates are exposed to one of three different pre-treatment operations.

FIG. 10 presents experimental results showing the reduction in the sheet resistance of cobalt seed layers after various pre-treatment processes are performed. Two different plasma treatments are shown, as well as one anneal pre-treatment. Plasma pre-treatment 1 was performed in a remote plasma processing chamber at a temperature of about 250° C., a pressure of about 1.5 Torr, for a duration of about 120 seconds. Plasma pre-treatment 2 was performed under the same conditions except that the pressure was lowered to 0.5 Torr. In both cases, the pre-treatment involved exposing the substrate to a remotely generated hydrogen plasma generated from $H_2$. The anneal pre-treatment process involved exposing the substrate to forming gas while the chamber was maintained at a temperature of about 350° C.

The degree of sheet resistance reduction depends greatly on the type of process used to deposit the seed layer, with ALD-deposited seed layers experiencing the greatest drop, PVD-deposited seed layers experiencing the lowest drop (and in some cases, the sheet resistance actually increased for PVD-deposited films), and CVD-deposited seed layers experiencing a drop in between that seen in ALD- and PVD-deposited seed layers. The PVD-deposited seed layer had a thickness of about 50 Å, the CVD-deposited seed layer had a thickness of about 30 Å, and the ALD-deposited seed layer had a thickness of about 35 Å.

The sheet resistance dropped considerably in all CVD- and ALD-deposited seed layers. The PVD-deposited seed layer only saw a decrease in resistance when the anneal pre-treatment was used. The anneal pre-treatment had the highest drop in sheet resistance for all of the seed layers.

The resulting conductivity gain was shown to be stable over a period of several hours. Further, the sheet resistance of the seed layers did not return to their original values even after several days. By maintaining the substrate in an environment that is oxygen-free and/or under vacuum between the time of the pre-treatment process and the electroplating process, the risk of re-oxidation is minimized. In some cases, the entire pre-treatment process and electroplating process (including any substrate transfer between these two processes) is conducted in an oxygen-free and/or vacuum environment.

Promoting Across-Wafer Uniformity

The relatively high resistance of cobalt seed layers, even after such seed layers are pre-treated as described above, can lead to substantial thickness non-uniformity over the face of the substrate. This non-uniformity is often referred to as the terminal effect. When electroplating, voltage/current is applied to the edge region of a substrate. Due to the highly resistive nature of thin seed layers (especially cobalt seed layers), there is a substantial drop in potential (and therefore in the local current density) over the face of the wafer, with the potential at the edges of the substrate having a much higher magnitude than the potential at the center of the substrate. One result of this drop in potential is that plating occurs more rapidly and to a greater extent around the edges of the substrate, while plating at the center of the substrate occurs slower and to a lesser extent (or sometimes not at all). The resulting film is center-thin and edge-thick.

Various techniques are available for combating this thickness variation. For instance, a number of hardware modifications can be used to promote a higher rate of plating toward the center of the substrate and a lower rate of plating toward the edges of the substrate. Some of these techniques involve using a dual cathode, a tertiary cathode, and/or a high resistance virtual anode (HRVA, also sometimes referred to as a channeled ionically resistive plate or CIRP), in combination with a high voltage power supply. However, these hardware modifications are not always sufficient to combat the thickness variation.

Another technique for combating this center-to-edge thickness variation is to use an electrolyte that has a relatively low conductivity. The low conductivity/high resistance electrolyte may act to create a voltage drop between the anode and the cathode. Where this voltage drop through the solution is sufficiently large, the voltage drop across the wafer becomes negligible and a high degree of across-wafer uniformity can be achieved. In other words, where the electrolyte has a sufficiently low conductivity/high resistance, the voltage drop through the electrolyte effectively swamps the voltage drop across the substrate and uniform plating can occur.

The conductivity of the electrolyte can be lowered by using relatively lower concentrations of ionic bath components, including but not limited to the cobalt ions, supporting electrolyte, and any acid/base present in the electrolyte.

A cobalt electroplating process may take place in a Watts-type plating bath. Such electroplating baths are commonly used for plating nickel, and may also be used for plating cobalt. Watts-type plating baths typically include boric acid ($H_3BO_3$), a metal sulfate, and chloride ions, typically from a metal chloride, but sometimes from hydrochloric acid. Where the bath is used to plate nickel, the metal chloride is nickel chloride and the metal sulfate is nickel sulfate. Similarly, where the bath is used to plate cobalt, the metal chloride is cobalt chloride and the metal sulfate is cobalt sulfate. In certain cases, hydrochloric acid may be used instead of the metal chloride. The boric acid may help prevent deposition of cobalt hydroxide, which may otherwise form if the local pH near the electrode surface rises during plating. The effect of boric acid is further described in relation to FIGS. 13A-13D, below. In some embodiments, the concentration of boric acid may be between about 1-45 g/L, for example between about 2-35 g/L, or between about 10-30 g/L. The pH of the electrolyte may be between about 3-6 in some embodiments. The concentration of chloride ions may be between about 1-1000 ppm, or between about 1-100 ppm, in certain cases. The concentration of cobalt sulfate may be chosen to achieve a particular concentration of cobalt ions, as discussed further below.

Watts-type plating baths are further discussed in Di Bari, G. A. (2010) Electrodeposition of Nickel, in Modern Electroplating, Fifth Edition (eds M. Schlesinger and M. Paunovic), John Wiley & Sons, Inc., Hoboken, N.J., USA, which is herein incorporated by reference.

The conductivity of a typical Watts-type plating bath is greater than about 20 mS/cm. The conductivity of the plating bath can be lowered by reducing the concentration of cobalt ions in the electrolyte. In some cases, the conductivity may be as low as about 0.5 mS/cm or as low as about 1 mS/cm.

Figures 11, 12:
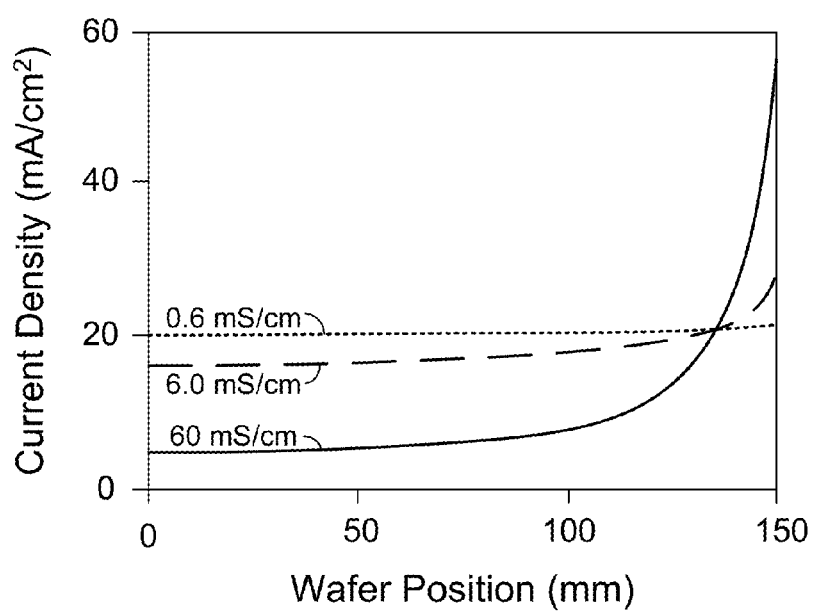
FIG. 11 is a table listing the conductivity of electrolyte at various concentrations of cobalt ions.
FIG. 12 illustrates the current density over the face of a substrate at different radial positions where three different electrolytes having differing conductivities are used.

FIG. 11 presents a table listing the conductivity of electrolyte at various concentrations of cobalt ions. Most of the examples shown are electrolytes having a low concentration of cobalt, though a typical Watts-type electrolyte (having 25 g/L Co(II)) is also shown for comparison.

In some embodiments, the electrolyte has a cobalt(II) ion concentration between about 0.3-5 g/L, or between about 0.005-0.1M. In these or other embodiments, the conductivity of the electrolyte may be between about 0.5-10 mS/cm, or between about 1-8 mS/cm, or between about 2-6 mS/cm. In certain embodiments, the conductivity of electrolyte may be at least about 1 mS/cm, for example at least about 2 mS/cm, or at least about 3 mS/cm. In these or other implementations, the conductivity of electrolyte may be about 10 mS/cm or less, for example about 8 mS/cm or less, or about 6 mS/cm or less.

FIG. 12 is a graph illustrating the current density during electroplating at different radial positions on a 300 mm diameter substrate. The substrates plated included a cobalt seed layer having an initial resistivity of about 50 $\Omega/cm^2$. Three different electrolytes are shown, each having a different conductivity. The electrolyte having the greatest conductivity (60 mS/cm) shows a much larger variation in current density across the substrate, with a high current density near the edge of the substrate (wafer position=150 mm) and a low current density near the center of the substrate (wafer position=0 mm). By contrast, the electrolyte having the lowest conductivity (0.6 mS/cm) exhibits the most uniform current density across the substrate. The electrolyte having a conductivity of 6.0 mS/cm showed relatively good current density uniformity.

As noted above, the electrolyte often includes boric acid. Other bath components may also help mitigate the terminal effect. For example, the electrolyte may also include hydrochloric acid and a wetting agent. Suitable wetting agents are described above in the section related to Rough vs. Smooth Film Deposition. In a particular example the wetting agent may be polyethylene glycol (PEG). Of course, the electrolyte may contain a number of other additives as discussed herein.

FIGS. 13A-13D together show the effect of including boric acid and polyethylene glycol when electroplating cobalt onto a substrate having a 30 nm thick cobalt seed layer deposited through CVD. Overall, the inclusion of boric acid and polyethylene glycol results in a significantly smoother film. The electrolytes tested had a concentration of about 1 g/L Co(II) ions. The electroplating process included a remote plasma pre-treatment step performed at about 250° C. and about 1.5 T. The substrates were plated at a current density of about 3 $mA/cm^2$ and a charge density of about 30 $mC/cm^2$, with substrate rotation occurring at about 100 RPM. The electrolytes had a pH of about 5.

Figures 13A, 13B, 13C:
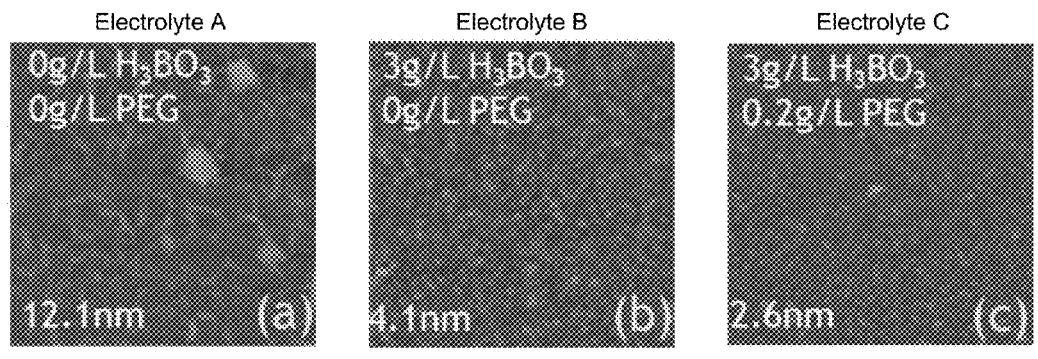
FIGS. 13A-13C depict films plated in three different electrolytes, with the resulting film roughness shown in each figure.
Figure 13D:
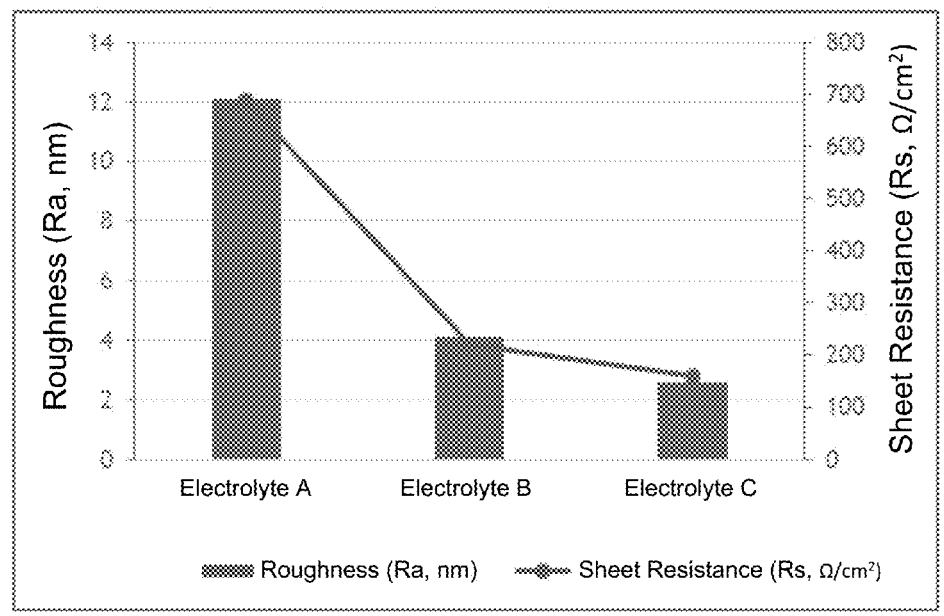
FIG. 13D is a graph illustrating the roughness and sheet resistance of each film shown in FIGS. 13A-13C.

FIGS. 13A-13C show AFM images of the cobalt films deposited using different electrolytes. FIG. 13D is a graph showing both the sheet resistance and the roughness of the films plated in the various electrolytes. The sheet resistance is shown by the dots/line, and the roughness is shown by the bars. The electrolyte of FIG. 13A (referred to as electrolyte A) did not include any boric acid or polyethylene glycol. The electrolyte of FIG. 13B (referred to as electrolyte B) included 3 g/L boric acid but no polyethylene glycol. The electrolyte of FIG. 13C (referred to as electrolyte C) included 3 g/L boric acid and 0.2 g/L polyethylene glycol.

The inclusion of boric acid reduced the roughness from about 12.1 nm in electrolyte A to about 4.1 nm in electrolyte B. The additional inclusion of polyethylene glycol further lowered the roughness to about 2.6 nm in electrolyte C. The sheet resistance was greatest in the case of electrolyte A and lowest in the case of electrolyte C.

The conductivity of the electrolyte is not affected by the concentration of boric acid; the conductivity at 0 g/L boric acid is essentially the same as that at 30 g/L boric acid. Boric acid does not dissociate in water at acidic nor near-neutral pH, so it does not contribute to the conductivity of the solution. It does interact with water molecules to form the weak base tetrahydroxyborate, which produces a slight acidity in aqueous solution.

Electrolytes having a relatively low concentration of cobalt (e.g., 0.3-5 g/L Co(II) ions) are capable of achieving high current efficiency (e.g., greater than about 90%). Various factors can impact the current efficiency including, but not limited to, the concentrations of various components/additives in the electrolyte and the current density applied during plating.

Figure 14A:
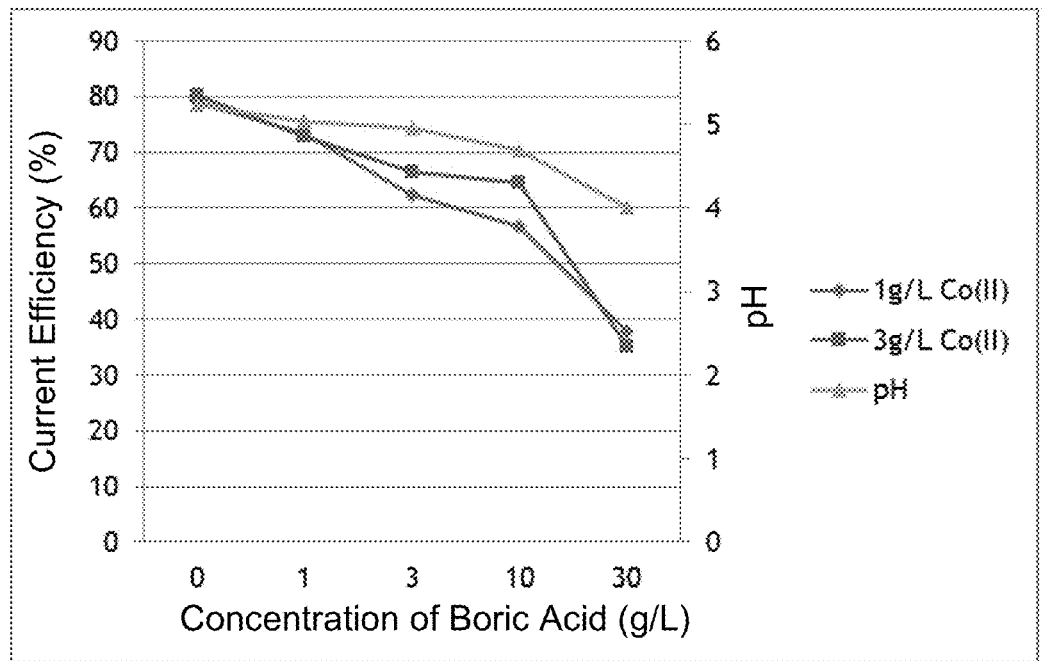
FIG. 14A is a graph showing the current efficiency and electrolyte pH as a function of the concentration of boric acid in the electrolyte.

FIG. 14A is a graph showing the current efficiency as a function of boric acid concentration. The substrates were platinum rotating disk electrodes plated at about 1 mA/cm2, in electrolyte that had either about 1 g/L Co(II) ions or about 3 g/L Co(II) ions. The pH as a function of boric acid concentration is also shown. Generally, the current efficiency is higher at relatively lower concentrations of boric acid.

Figure 14B:
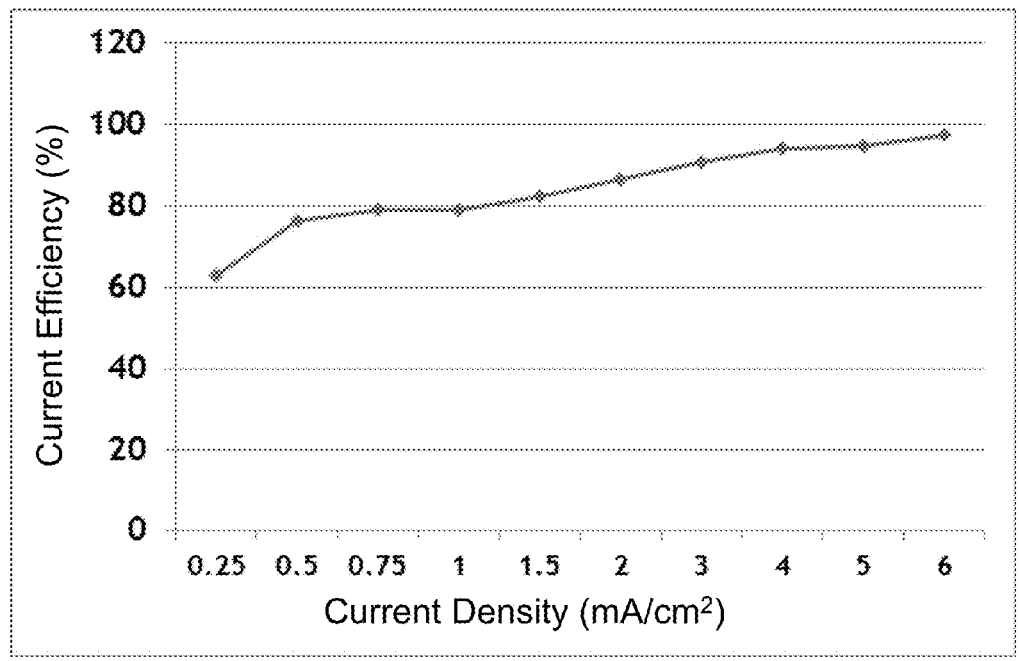
FIG. 14B is a graph illustrating the current efficiency as a function of current density.

FIG. 14B is a graph showing the current efficiency as a function of current density. The substrates were platinum rotating disk electrodes plated in electrolyte having about 1 g/L Co(II) ions and no boric acid. The current efficiency is generally higher at greater current densities. Very high current efficiencies can be achieved.

Electroplating Waveform

The disclosed embodiments are not limited to cases where the plating process uses any particular waveform. However, certain waveform features may help promote high quality electroplating results. For example, cold entry may be used, followed by a short induction period immediately after the substrate is immersed. The induction period may have a duration between about 0.5-5 seconds, for example between about 0.5-1.5 seconds. During cold entry and this induction period, no voltage or current is applied to the substrate, which may be useful to help dissolve any cobalt oxide that may be present on the surface of the substrate. The acidic nature of the electrolyte helps promote the oxide dissolution. After the induction period, plating may occur at a constant current density as the recessed features are filled with cobalt. The current density may be applied as described herein, and in certain cases the current density during bottom-up fill is between about 0.5-7 $mA/cm^2$. This may correspond to a total plating potential between about −1.5 and −2.5 V, for example between about −1.8 and −2.0 V with respect to a $HgSO_4$ mercury sulfate reference electrode. After the features are filled or substantially filled, the current density may be increased while the overburden cobalt is deposited. In some cases, the current density may be increased to a value between about 3-15 $mA/cm^2$, for example about 3-10 $mA/cm^2$ or between about 5-10 $mA/cm^2$.

Apparatus

The methods described herein may be performed by any suitable apparatus. A suitable apparatus includes hardware for accomplishing the process operations and a system controller having instructions for controlling process operations in accordance with the present embodiments. For example, in some embodiments, the hardware may include one or more process stations included in a process tool.

Figure 15:
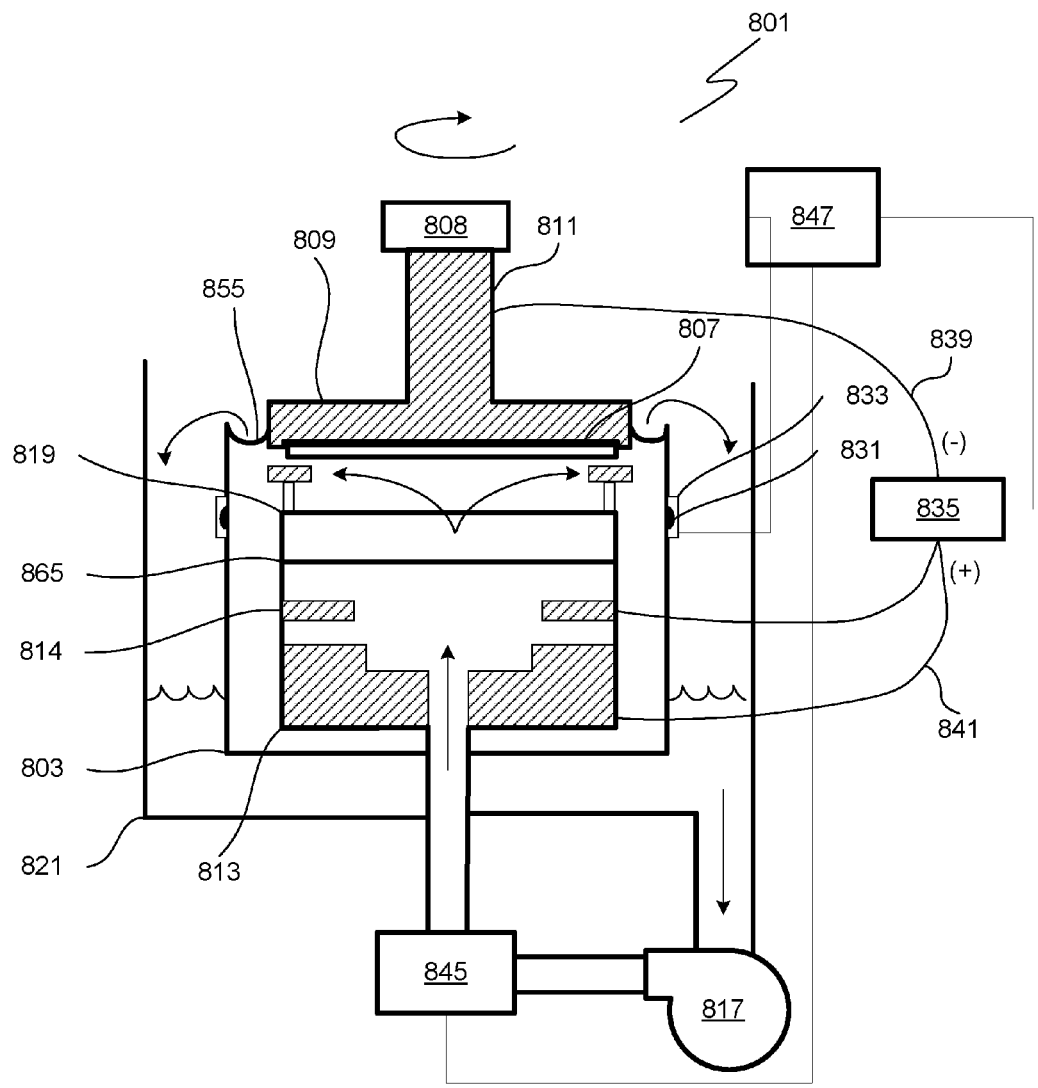
FIG. 15 illustrates a simplified view of an electroplating apparatus according to certain embodiments.

One example apparatus for performing the disclosed methods is shown in FIG. 15. The apparatus includes one or more electroplating cells in which the substrates (e.g., wafers) are processed. Only a single electroplating cell is shown in FIG. 15 to preserve clarity. To optimize bottom-up electroplating, additives (e.g., accelerators and suppressors) may be added to the electrolyte as described herein; however, an electrolyte with additives may react with the anode in undesirable ways. Therefore anodic and cathodic regions of the plating cell are sometimes separated by a membrane so that plating solutions of different composition may be used in each region. Plating solution in the cathodic region is called catholyte; and in the anodic region, anolyte. A number of engineering designs can be used in order to introduce anolyte and catholyte into the plating apparatus.

Referring to FIG. 15, a diagrammatical cross-sectional view of an electroplating in accordance with one embodiment is shown. The plating bath 803 contains the plating solution (having a composition as described herein), which is shown at a level 855. The catholyte portion of this vessel is adapted for receiving substrates in a catholyte. A wafer 807 is immersed into the plating solution and is held by, e.g., a "clamshell" holding fixture 809, mounted on a rotatable spindle 811, which allows rotation of clamshell 809 together with the wafer 807. A general description of a clamshell-type plating apparatus having aspects suitable for use with this invention is described in detail in U.S. Pat. No. 6,156,167 issued to Patton et al., and U.S. Pat. No. 6,800,187 issued to Reid et al, which are incorporated herein by reference in their entireties.

An anode 813 is disposed below the wafer within the plating bath 803 and is separated from the wafer region by a membrane 865, such as an ion selective membrane. For example, Nafion™ cationic exchange membrane (CEM) may be used. The region below the anodic membrane is often referred to as an "anode chamber." The ion-selective anode membrane 865 allows ionic communication between the anodic and cathodic regions of the plating cell, while preventing the particles generated at the anode from entering the proximity of the wafer and contaminating it. The anode membrane is also useful in redistributing current flow during the plating process and thereby improving the plating uniformity. Detailed descriptions of suitable anodic membranes are provided in U.S. Pat. Nos. 6,126,798 and 6,569,299 issued to Reid et al., both incorporated herein by reference in their entireties. Ion exchange membranes, such as cationic exchange membranes are especially suitable for these applications. These membranes are typically made of ionomeric materials, such as perfluorinated co-polymers containing sulfonic groups (e.g. Nafion™), sulfonated polyimides, and other materials known to those of skill in the art to be suitable for cation exchange. Selected examples of suitable Nafion™ membranes include N324 and N424 membranes available from Dupont de Nemours Co.

During plating the ions from the plating solution are deposited on the substrate. The metal ions must diffuse through the diffusion boundary layer and into the recessed feature (if present). A typical way to assist the diffusion is through convection flow of the electroplating solution provided by the pump 817. Additionally, a vibration agitation or sonic agitation member may be used as well as wafer rotation. For example, a vibration transducer 808 may be attached to the wafer chuck 809.

The plating solution is continuously provided to plating bath 803 by the pump 817. Generally, the plating solution flows upwards through an anode membrane 865 and a diffuser plate 819 to the center of wafer 807 and then radially outward and across wafer 807. The plating solution also may be provided into anodic region of the bath from the side of the plating bath 803. The plating solution then overflows plating bath 803 to an overflow reservoir 821. The plating solution is then filtered (not shown) and returned to pump 817 completing the recirculation of the plating solution. In certain configurations of the plating cell, a distinct electrolyte is circulated through the portion of the plating cell in which the anode is contained while mixing with the main plating solution is prevented using sparingly permeable membranes or ion selective membranes.

A reference electrode 831 is located on the outside of the plating bath 803 in a separate chamber 833, which chamber is replenished by overflow from the main plating bath 803. Alternatively, in some embodiments the reference electrode is positioned as close to the substrate surface as possible, and the reference electrode chamber is connected via a capillary tube or by another method, to the side of the wafer substrate or directly under the wafer substrate. In some embodiments, the apparatus further includes contact sense leads that connect to the wafer periphery and which are configured to sense the potential of the metal seed layer at the periphery of the wafer but do not carry any current to the wafer.

A reference electrode 831 may be employed to facilitate electroplating at a controlled potential. The reference electrode 831 may be one of a variety of commonly used types such as mercury/mercury sulfate, silver chloride, saturated calomel, or copper metal. A contact sense lead in direct contact with the wafer 807 may be used in some embodiments, in addition to the reference electrode, for more accurate potential measurement (not shown).

A DC power supply 835 can be used to control current flow to the wafer 807. The power supply 835 has a negative output lead 839 electrically connected to wafer 807 through one or more slip rings, brushes and contacts (not shown). The positive output lead 841 of power supply 835 is electrically connected to an anode 813 located in plating bath 803. The power supply 835, a reference electrode 831, and a contact sense lead (not shown) can be connected to a system controller 847, which allows, among other functions, modulation of current and potential provided to the elements of electroplating cell. For example, the controller may allow electroplating in potential-controlled and current-controlled regimes. The controller may include program instructions specifying current and voltage levels that need to be applied to various elements of the plating cell, as well as times at which these levels need to be changed. When forward current is applied, the power supply 835 biases the wafer 807 to have a negative potential relative to anode 813. This causes an electrical current to flow from anode 813 to the wafer 807, and an electrochemical reduction reaction occurs on the wafer surface (the cathode), which results in the deposition of the electrically conductive layer (e.g. cobalt) on the surfaces of the wafer. An inert anode 814 may be installed below the wafer 807 within the plating bath 803 and separated from the wafer region by the membrane 865.

The apparatus may also include a heater 845 for maintaining the temperature of the plating solution at a specific level. The plating solution may be used to transfer the heat to the other elements of the plating bath. For example, when a wafer 807 is loaded into the plating bath the heater 845 and the pump 817 may be turned on to circulate the plating solution through the electroplating apparatus 801, until the temperature throughout the apparatus becomes substantially uniform. In one embodiment the heater is connected to the system controller 847. The system controller 847 may be connected to a thermocouple to receive feedback of the plating solution temperature within the electroplating apparatus and determine the need for additional heating.

The controller will typically include one or more memory devices and one or more processors. The processor may include a CPU or computer, analog and/or digital input/output connections, stepper motor controller boards, etc. In certain embodiments, the controller controls all of the activities of the electroplating apparatus and/or of a pre-wetting chamber used to wet the surface of the substrate before electroplating begins. The controller may also control all the activities of an apparatus used to deposit a seed layer, as well as all of the activities involved in transferring the substrate between the relevant apparatus.

For example, the controller may include instructions for depositing a seed layer, transferring the seed layer to a pre-treatment chamber, performing pre-treatment, and electroplating in accordance with any method described above or in the appended claims. Non-transitory machine-readable media containing instructions for controlling process operations in accordance with the present invention may be coupled to the system controller.

Typically there will be a user interface associated with controller 847. The user interface may include a display screen, graphical software displays of the apparatus and/or process conditions, and user input devices such as pointing devices, keyboards, touch screens, microphones, etc.

The computer program code for controlling electroplating processes can be written in any conventional computer readable programming language: for example, assembly language, C, C++, Pascal, Fortran or others. Compiled object code or script is executed by the processor to perform the tasks identified in the program.

Figure 16:
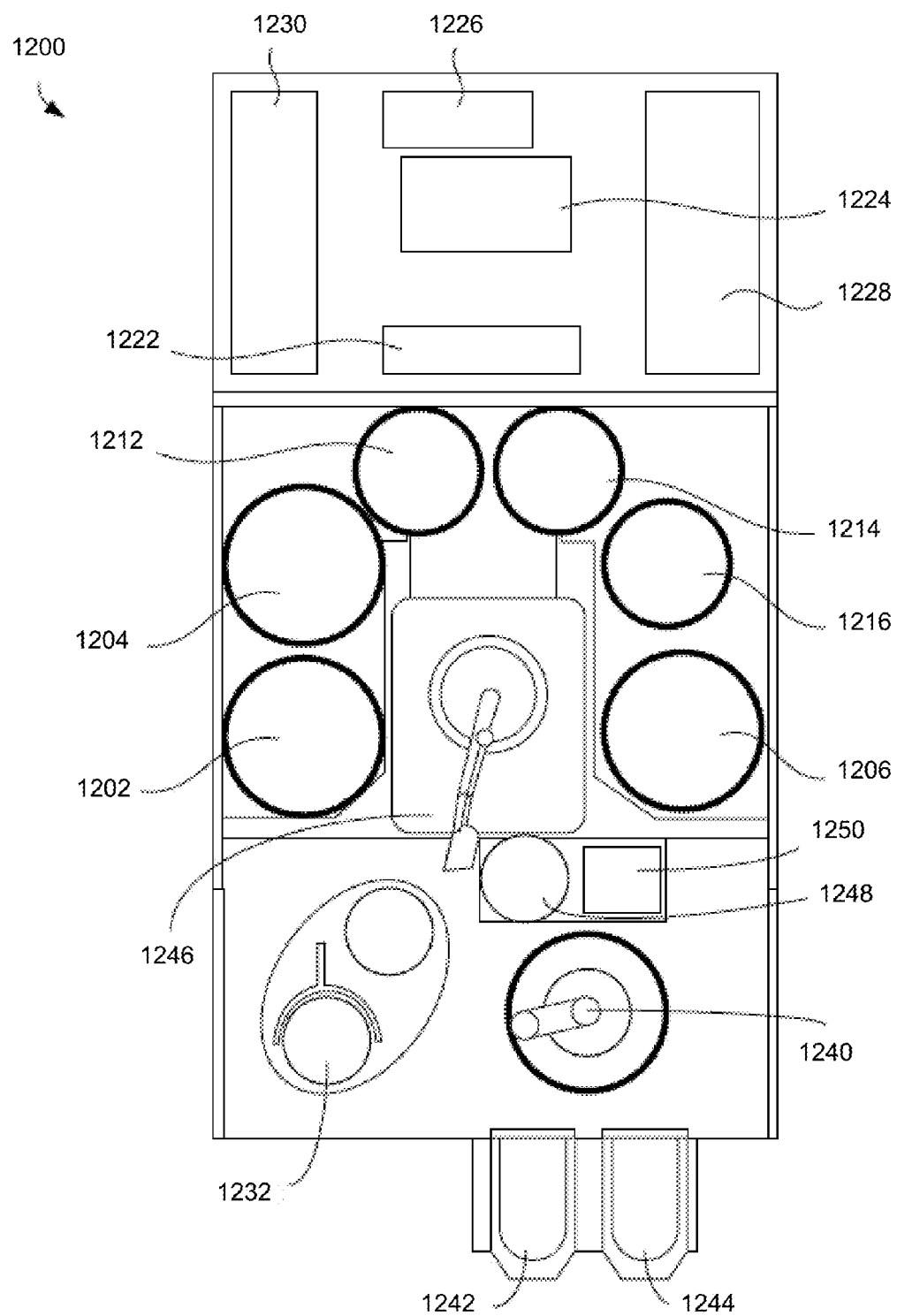
FIGS. 16 and 17 present simplified views of multi-station electroplating systems according to certain embodiments.

FIG. 16 shows an example multi-tool apparatus that may be used to implement the embodiments herein. The electrodeposition apparatus 1200 can include three separate electroplating modules 1202, 1204, and 1206. Further, three separate modules 1212, 1214 and 1216 may be configured for various process operations. For example, in some embodiments, one or more of modules 1212, 1214, and 1216 may be a spin rinse drying (SRD) module. In these or other embodiments, one or more of the modules 1212, 1214, and 1216 may be post-electrofill modules (PEMs), each configured to perform a function, such as edge bevel removal, backside etching, and acid cleaning of substrates after they have been processed by one of the electroplating modules 1202, 1204, and 1206. Further, one or more of the modules 1212, 1214, and 1216 may be configured as a pre-treatment chamber. The pre-treatment chamber may be a remote plasma chamber or an anneal chamber as described herein. Alternatively, a pre-treatment chamber may be included at another portion of the apparatus, or in a different apparatus.

The electrodeposition apparatus 1200 includes a central electrodeposition chamber 1224. The central electrodeposition chamber 1224 is a chamber that holds the chemical solution used as the electroplating solution in the electroplating modules 1202, 1204, and 1206. The electrodeposition apparatus 1200 also includes a dosing system 1226 that may store and deliver additives for the electroplating solution. A chemical dilution module 1222 may store and mix chemicals to be used as an etchant. A filtration and pumping unit 1228 may filter the electroplating solution for the central electrodeposition chamber 1224 and pump it to the electroplating modules.

A system controller 1230 provides electronic and interface controls used to operate the electrodeposition apparatus 1200. The system controller 1230 is introduced above in the System Controller section, and is described further herein.

The system controller 1230 (which may include one or more physical or logical controllers) controls some or all of the properties of the electroplating apparatus 1200. The system controller 1230 typically includes one or more memory devices and one or more processors. The processor may include a central processing unit (CPU) or computer, analog and/or digital input/output connections, stepper motor controller boards, and other like components. Instructions for implementing appropriate control operations as described herein may be executed on the processor. These instructions may be stored on the memory devices associated with the system controller 1230 or they may be provided over a network. In certain embodiments, the system controller 1230 executes system control software.

The system control software in the electrodeposition apparatus 1200 may include instructions for controlling the timing, mixture of electrolyte components (including the concentration of one or more electrolyte components), electrolyte gas concentrations, inlet pressure, plating cell pressure, plating cell temperature, substrate temperature, current and potential applied to the substrate and any other electrodes, substrate position, substrate rotation, and other parameters of a particular process performed by the electrodeposition apparatus 1200.

In some embodiments, there may be a user interface associated with the system controller 1230. The user interface may include a display screen, graphical software displays of the apparatus and/or process conditions, and user input devices such as pointing devices, keyboards, touch screens, microphones, etc.

In some embodiments, parameters adjusted by the system controller 1230 may relate to process conditions. Non-limiting examples include solution conditions (temperature, composition, and flow rate), substrate position (rotation rate, linear (vertical) speed, angle from horizontal) at various stages, etc. These parameters may be provided to the user in the form of a recipe, which may be entered utilizing the user interface.

Signals for monitoring the process may be provided by analog and/or digital input connections of the system controller 1230 from various process tool sensors. The signals for controlling the process may be output on the analog and digital output connections of the process tool. Non-limiting examples of process tool sensors that may be monitored include mass flow controllers, pressure sensors (such as manometers), thermocouples, optical position sensors, etc. Appropriately programmed feedback and control algorithms may be used with data from these sensors to maintain process conditions.

In one embodiment of a multi-tool apparatus, the instructions can include inserting the substrate in a wafer holder, tilting the substrate, biasing the substrate during immersion, and electrodepositing cobalt on a substrate. The instructions may further include pre-treating the substrate, annealing the substrate after electroplating, and transferring the substrate as appropriate between relevant apparatus.

A hand-off tool 1240 may select a substrate from a substrate cassette such as the cassette 1242 or the cassette 1244. The cassettes 1242 or 1244 may be front opening unified pods (FOUPs). A FOUP is an enclosure designed to hold substrates securely and safely in a controlled environment and to allow the substrates to be removed for processing or measurement by tools equipped with appropriate load ports and robotic handling systems. The hand-off tool 1240 may hold the substrate using a vacuum attachment or some other attaching mechanism.

The hand-off tool 1240 may interface with a wafer handling station 1232, the cassettes 1242 or 1244, a transfer station 1250, or an aligner 1248. From the transfer station 1250, a hand-off tool 1246 may gain access to the substrate. The transfer station 1250 may be a slot or a position from and to which hand-off tools 1240 and 1246 may pass substrates without going through the aligner 1248. In some embodiments, however, to ensure that a substrate is properly aligned on the hand-off tool 1246 for precision delivery to an electroplating module, the hand-off tool 1246 may align the substrate with an aligner 1248. The hand-off tool 1246 may also deliver a substrate to one of the electroplating modules 1202, 1204, or 1206, or to one of the separate modules 1212, 1214 and 1216 configured for various process operations.

An apparatus configured to allow efficient cycling of substrates through sequential plating, rinsing, drying, and PEM process operations may be useful for implementations for use in a manufacturing environment. To accomplish this, the module 1212 can be configured as a spin rinse dryer and an edge bevel removal chamber. With such a module 1212, the substrate would only need to be transported between the electroplating module 1204 and the module 1212 for the copper plating and EBR operations. One or more internal portions of the apparatus 1200 may be under sub-atmospheric conditions. For instance, in some embodiments, the entire area enclosing the plating cells 1202, 1204 and 1206 and the PEMs 1212, 1214 and 1216 may be under vacuum. In other embodiments, an area enclosing only the plating cells is under vacuum. In further implementations, the individual plating cells may be under vacuum. While electrolyte flow loops are not shown in FIG. 16 or 17, it is understood that the flow loops described herein may be implemented as part of (or in conjunction with) a multi-tool apparatus.

Figure 17:
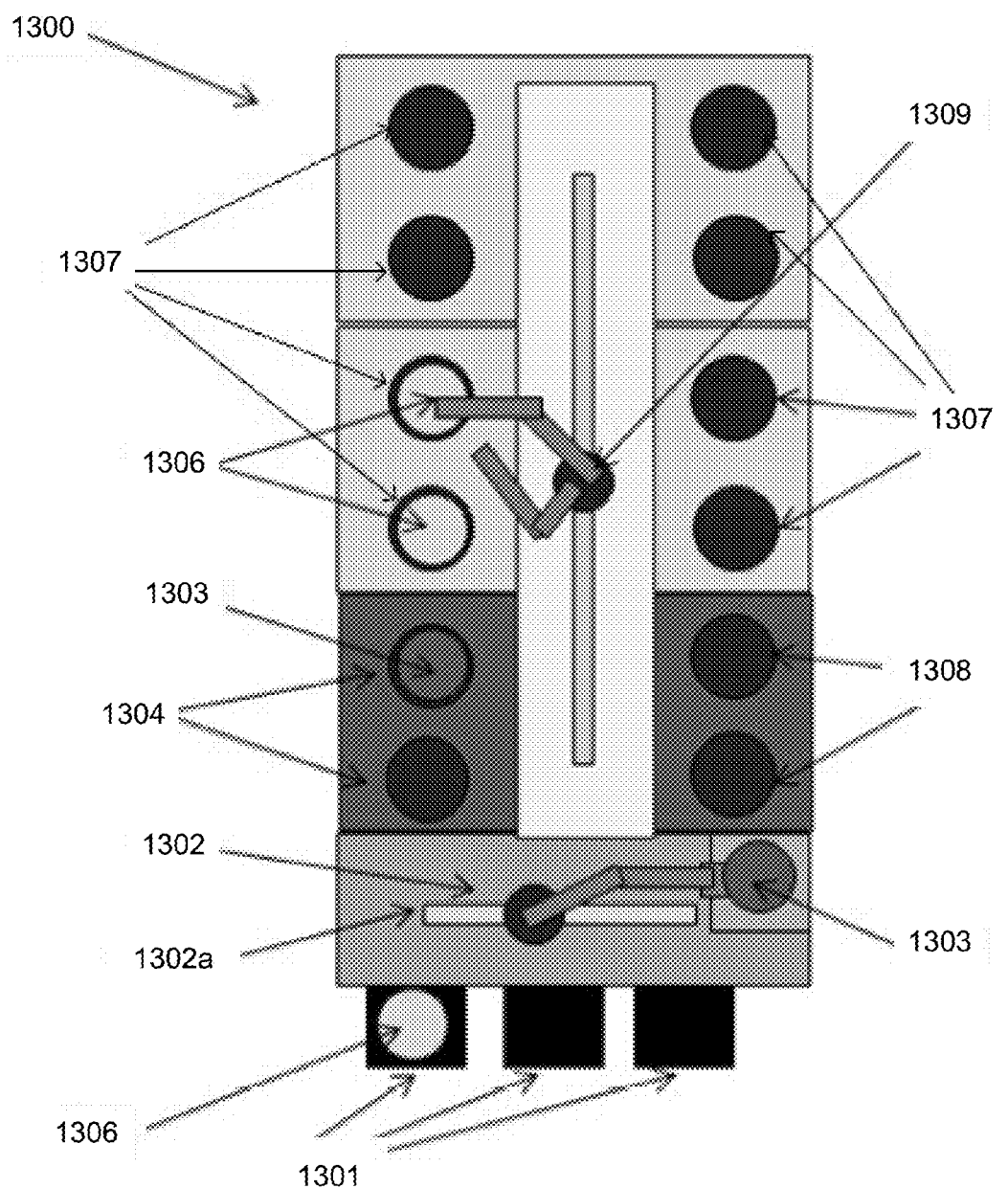

FIG. 17 shows an additional example of a multi-tool apparatus that may be used in implementing the embodiments herein. In this embodiment, the electrodeposition apparatus 1300 has a set of electroplating cells 1307, each containing an electroplating bath, in a paired or multiple "duet" configuration. In addition to electroplating per se, the electrodeposition apparatus 1300 may perform a variety of other electroplating related processes and sub-steps, such as spin-rinsing, spin-drying, metal and silicon wet etching, electroless deposition, pre-wetting and pre-chemical treating, reducing, annealing, photoresist stripping, and surface pre-activation, for example. The electrodeposition apparatus 1300 is shown schematically looking top down, and only a single level or "floor" is revealed in the figure, but it is to be readily understood by one having ordinary skill in the art that such an apparatus, e.g., the Sabre™ 3D tool of Lam Research Corporation of Fremont, Calif. can have two or more levels "stacked" on top of each other, each potentially having identical or different types of processing stations.

Referring once again to FIG. 17, the substrates 1306 that are to be electroplated are generally fed to the electrodeposition apparatus 1300 through a front end loading FOUP 1301 and, in this example, are brought from the FOUP to the main substrate processing area of the electrodeposition apparatus 1300 via a front-end robot 1302 that can retract and move a substrate 1306 driven by a spindle 1303 in multiple dimensions from one station to another of the accessible stations—two front-end accessible stations 1304 and also two front-end accessible stations 1308 are shown in this example. The front-end accessible stations 1304 and 1308 may include, for example, pre-treatment stations, and spin rinse drying (SRD) stations. These stations 1304 and 1308 may also be removal stations as described herein.

Lateral movement from side-to-side of the front-end robot 1302 is accomplished utilizing robot track 1302a. Each of the substrates 1306 may be held by a cup/cone assembly (not shown) driven by a spindle 1303 connected to a motor (not shown), and the motor may be attached to a mounting bracket 1309. Also shown in this example are the four "duets" of electroplating cells 1307, for a total of eight electroplating cells 1307. The electroplating cells 1307 may be used for electroplating copper for the copper containing structure and electroplating solder material for the solder structure (among other possible materials). A system controller (not shown) may be coupled to the electrodeposition apparatus 1300 to control some or all of the properties of the electrodeposition apparatus 1300. The system controller may be programmed or otherwise configured to execute instructions according to processes described earlier herein.

System Controller

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. A method of electroplating cobalt into recessed features on a substrate, the method comprising:
receiving the substrate in an electroplating chamber, the substrate comprising recessed features having a cobalt seed layer thereon, the cobalt seed layer having a thickness of about 50 Å or less, and the recessed features having a width between about 10-150 nm;
immersing the substrate in electrolyte, the electrolyte comprising boric acid, halide ions, cobalt ions, and organic additives for achieving seam-free bottom-up fill in the recessed features; and
electroplating cobalt into the features under conditions that provide bottom-up fill, wherein a plating potential at the substrate during electroplating has a magnitude between about 1.8-3.5 V vs. a $HgSO_4$ mercury sulfate reference electrode.

2. The method of claim 1, wherein the electrolyte has a conductivity of about 10 mS/cm or less.

3. The method of claim 1, wherein the electrolyte has a cobalt ion concentration of about 5 g/L or less.

4. The method of claim 1, wherein the organic additives comprise a suppressor that comprises a nitrogen-containing group.

5. The method of claim 4, wherein the suppressor comprises an amine group.

6. The method of claim 5, wherein the suppressor comprises polyethyleneimine (PEI).

7. The method of claim 1, wherein the organic additives comprise an accelerator, the accelerator being selected from the group consisting of 3-mercapto-1-propane sulfonic acid sodium salt (MPS), thiourea, and combinations thereof.

8. The method of claim 7, wherein the organic additives further comprise a suppressor comprising polyethyleneimine (PEI).

9. The method of claim 8, wherein the suppressor is present in the electrolyte at a concentration between about 10-60 ppm, wherein the accelerator is present in the electrolyte at a concentration between about 150-400 ppm, and wherein electroplating occurs at a constant current density during bottom-up fill, the current density being between about 0.5-7 $mA/cm^2$.

10. The method of claim 1, wherein the organic additives comprise an accelerator and a suppressor, and wherein a ratio of the concentration of accelerator to the concentration of suppressor in the electrolyte is at least about 3:1, as measured in ppm.

11. The method of claim 10, wherein the concentration of accelerator in the electrolyte is between about 150-500 ppm and wherein the concentration of suppressor in the electrolyte is between about 10-60 ppm.

12. The method of claim 1 further comprising:
before receiving the substrate in the electroplating chamber, pre-treating the substrate by exposing the substrate to a remotely generated hydrogen-containing plasma to thereby reduce oxides present on the cobalt seed layer.

13. The method of claim 12, wherein the remote plasma pre-treatment reduces the seed layer's sheet resistance by at least about 15% to a value that is between about 50-1000 $\Omega/cm^2$.

14. The method of claim 1, further comprising:
before receiving the substrate in the electroplating chamber, annealing the substrate at a temperature of at least about 75° C. while the substrate is exposed to reducing gas to thereby reduce oxides present on the cobalt seed layer.

15. The method of claim 14, wherein the anneal pre-treatment reduces the seed layer's sheet resistance by at least about 15% to a value that is between about 50-1000 $\Omega/cm^2$.

16. The method of claim 1, wherein the substrate is immersed at open circuit conditions, and wherein an induction period occurs after immersion, during which no voltage or current is applied to the substrate, the induction period having a duration between about 0.5-5 seconds.

17. The method of claim 1, wherein the electrolyte further includes a leveler and/or wetting agent.

18. The method of claim 17, wherein the leveler and/or wetting agent comprises polyethylene glycol (PEG), the PEG being present in electrolyte at a concentration between about 10-500 ppm.

19. The method of claim 18, wherein the electroplated cobalt has an RMS roughness of about 3 nm or lower.

20. The method of claim 1, wherein the electrolyte comprises:
(i) between about 0.5-5 g/L cobalt(II) ions,
(ii) between about 2-35 g/L boric acid,
(iii) between about 0.1-0.3 g/L polyethylene glycol, and
(iv) a pH between about 4-6.

21. The method of claim 1, wherein the electrolyte comprises:
(i) an accelerator selected from the group consisting of: N,N-dimethyl-dithiocarbamic acid (-3-sulfopropyl)ester, 3-mercapto-propylsulfonic acid-(3-sulfurpropyl) ester, 3-sulfanyl-1-propane sulfonate, carbonic acid-dithio-o-ethylester-s-ester with 3-mercapto-1-propane sulfonic acid potassium salt, bis-sulfopropyl disulfide, 3-(benzothiazolyl-s-thio)propyl sulfonic acid sodium salt, pyridinium propyl sulfobetaine, 1-sodium-3-mercaptopropane-1-sulfonate, N,N-dimethyl-dithiocarbamic acid-(3-sulfoethyl)ester, 3-mercapto-ethyl propylsulfonic acid (3-sulfoethyl)ester, 3-mercapto-ethylsulfonic acid sodium salt, carbonic acid-dithio-o-ethyl ester-s-ester, pyridinium ethyl sulfobetaine, thiourea, and combinations thereof; and
(ii) a suppressor selected from the group consisting of: carboxymethylcellulose, nonylphenolpolyglycol ether, polyethylene glycoldimethyl ether, octandiolbis(polyalkylene glycol ether), octanol polyalkylene glycol ether, oleic acid polyglycol ester, polyethylene propylene glycol, polyethylene glycol, polyethyleneimine, polyethylene glycoldimethyl ether, polyoxypropylene glycol, polypropylene glycol, polyvinyl alcohol, stearic acid polyglycol ester, stearyl alcohol polyglycol ether, polyethylene oxide, ethylene oxide-propylene oxide copolymers, butyl alcohol-ethylene oxide-propylene oxide copolymers, 2-Mercapto-5-benzimidazolesulfonic acid, 2-mercaptobenzimidazole (MBI), benzotriazole, and combinations thereof.

22. The method of claim 21, wherein the electrolyte further comprises:
(iii) a leveler selected from the group consisting of: alkylated polyalkyleneimines, polyethylene glycol, organic sulfonates, 4-mercaptopyridine, 2-mercaptothiazoline, ethylene thiourea, thiourea, 1-(2-hydroxyethyl)2-imidazolidinethion, sodium naphthalene 2-sulphonate, acrylamide, substituted amines, imidazole, triazole, tetrazole, piperidine, morpholine, piperazine, pyridine, oxazole, benzoxazole, quinolin, isoquinoline, coumarin, butyne 1:4 diol and derivatives thereof, and combinations thereof;
(iv) a wetting agent selected from the group consisting of: alkyl phenoxy polyethoxyethanols, compounds of polyoxyethylene and polyethyleneglycol polymers, block and random copolymers of polyoxyethylene and polyoxypropylene, and combinations thereof; and
(v) a brightening agent selected from the group consisting of: 3-sulfanyl-1-propane sulfonate, 2-mercapto-ethane sulfonic acid sodium salt, bisulfopropyl disulfide, N,N-dimethyldithiocarbamic acid ester sodium salt, (o-ethyldithiocarbonato)-S-(3-sulfurpropyl)-ester potassium salt, 3-[(amino-iminomethyl)-thio]-1-propane sulfonic acid sodium salt, phenolphthalein, lactone, lactams, cyclic sulfate esters, cyclic imides, cyclic oxazolinones, assymetrical alkyne sulfonic acids, (N-substituted pyridyl)-alkyl sulfonic acid betaines, amino polyarylmethanes, pyridine derivatives, quinoline derivatives, sulfonated aryl aldehydes, and combinations thereof.

* * * * *